United States Patent
Otaka et al.

(10) Patent No.: US 10,645,327 B2
(45) Date of Patent: May 5, 2020

(54) SOLID-STATE IMAGING DEVICE, METHOD FOR DRIVING SOLID-STATE IMAGING DEVICE, AND ELECTRONIC APPARATUS

(71) Applicant: Brillnics Inc., Grand Cayman (KY)

(72) Inventors: Toshinori Otaka, Tokyo (JP); Kazuya Mori, Tokyo (JP)

(73) Assignee: BRILLNICS INC., Grand Cayman (KY)

( * ) Notice: Subject to any disclaimer, the term of this patent is extended or adjusted under 35 U.S.C. 154(b) by 0 days.

(21) Appl. No.: 16/168,276

(22) Filed: Oct. 23, 2018

(65) Prior Publication Data
US 2019/0132539 A1 May 2, 2019

(30) Foreign Application Priority Data
Oct. 26, 2017 (JP) .................. 2017-207029

(51) Int. Cl.
*H04N 5/378* (2011.01)
*H03M 1/10* (2006.01)
(Continued)

(52) U.S. Cl.
CPC ......... *H04N 5/378* (2013.01); *H01L 27/1464* (2013.01); *H01L 27/14609* (2013.01);
(Continued)

(58) Field of Classification Search
CPC .. H04N 5/378; H04N 3/1562; H04N 5/37455; H04N 5/361; H03M 1/1023;
(Continued)

(56) References Cited

U.S. PATENT DOCUMENTS 7,164,114 B2 1/2007 Lai et al.
8,553,122 B2 10/2013 Nitta et al.
(Continued)

FOREIGN PATENT DOCUMENTS

JP 2005-278135 A 10/2005
JP 2005-295346 A 10/2005

*Primary Examiner* — Yogesh K Aggarwal
(74) *Attorney, Agent, or Firm* — Westerman, Hattori, Daniels & Adrian, LLP

(57) ABSTRACT

A comparator in an AD conversion part, under the control of a reading part, performs a first comparison processing outputting a digitized first comparison result signal with respect to a voltage signal corresponding to an overflow charge overflowing from a PD1 to an FD1 in an integration period, and a second comparison processing outputting a digitized second comparison result signal with respect to a voltage signal corresponding to a accumulated charge of the PD1 transferred to the FD1 in a transfer period after the integration period and, in the first comparison processing, the period of the first comparison processing is divided into a plurality of sub periods and, in each of the sub periods, the comparator performs an AD conversion processing comparing the voltage signal of the output buffer part and the reference voltage and outputting the digitized comparison result signal. Due to this, it is possible to suppress an influence of a dark current of the FD, and becomes possible to suppress deterioration of the image while substantially realizing a broader dynamic range and a higher frame rate.

20 Claims, 23 Drawing Sheets

(51) Int. Cl.
  *H04N 3/14* (2006.01)
  *H03M 1/56* (2006.01)
  *H01L 27/146* (2006.01)
  *H04N 5/3745* (2011.01)
  *H04N 5/361* (2011.01)

(52) U.S. Cl.
  CPC .. *H01L 27/14612* (2013.01); *H01L 27/14627* (2013.01); *H01L 27/14634* (2013.01); *H01L 27/14643* (2013.01); *H03M 1/1023* (2013.01); *H03M 1/56* (2013.01); *H04N 3/1562* (2013.01); *H04N 5/361* (2013.01); *H04N 5/37455* (2013.01)

(58) Field of Classification Search
  CPC .............. H03M 1/56; H01L 27/14627; H01L 27/14609; H01L 27/14643; H01L 27/14612; H01L 27/14634; H01L 27/1464
  USPC ........ 348/294–324; 257/290–292; 250/208.1
  See application file for complete search history.

(56) References Cited

U.S. PATENT DOCUMENTS

| | | |
|---|---|---|
| 9,313,435 B2 | 4/2016 | Nitta et al. |
| 9,769,411 B2 | 9/2017 | Nitta et al. |
| 2010/0181464 A1 | 7/2010 | Veeder |
| 2011/0199526 A1 | 8/2011 | Nitta et al. |
| 2014/0209784 A1* | 7/2014 | Morita ............... H04N 5/378 250/208.1 |
| 2014/0285697 A1 | 9/2014 | Nitta et al. |
| 2015/0014517 A1* | 1/2015 | Ikebe ............... H03M 1/14 250/208.1 |
| 2016/0295145 A1 | 10/2016 | Nitta et al. |
| 2018/0098037 A1* | 4/2018 | Kumaki ............ H03M 1/0658 |

* cited by examiner

Light to time conversion plot at various reference voltage at comparator input

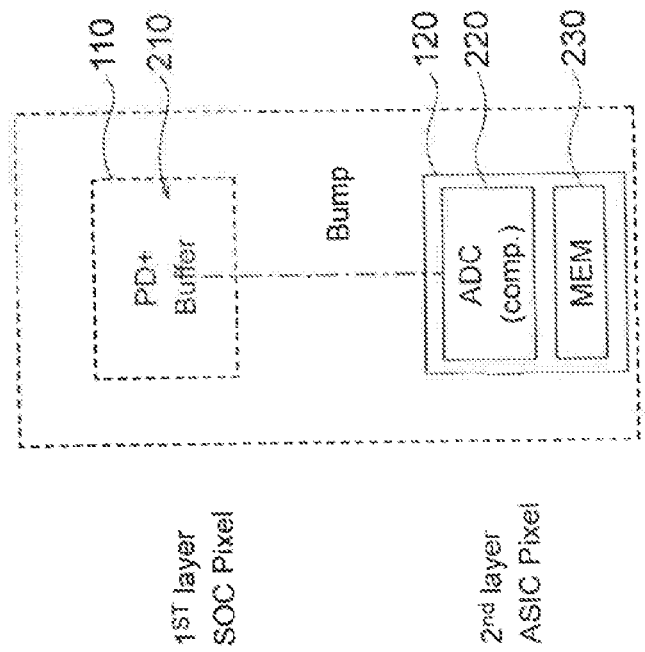
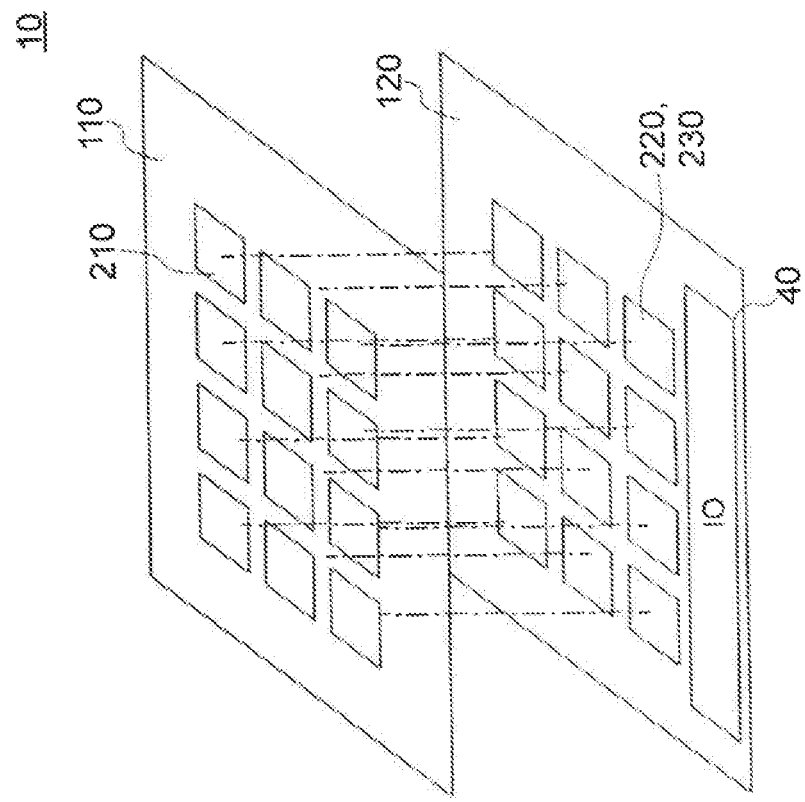

Read out timing example

An example of light – digital code plot.
15n sampling for 256 code (3usec integration time)
150uV/e with linear ramped reference voltage (10mV – 800mV)

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATIONS

The present invention contains subject matter related to Japanese Patent Application JP 2017-207029 filed in the Japan Patent Office on Oct. 26, 2017, the entire contents of which being incorporated herein by reference.

TECHNICAL FIELD

The present invention relates to a solid-state imaging device, a method for driving a solid-state imaging device, and an electronic apparatus.

BACKGROUND ART

As solid-state imaging devices (image sensors) using photoelectric conversion elements detecting light and generating a charge, CMOS (complementary metal oxide semiconductor) image sensors have been put into practical use. CMOS image sensors have been widely applied as parts of digital cameras, video cameras, monitoring cameras, medical endoscopes, personal computers (PC), mobile phones and other portable terminals (mobile devices) and other various types of electronic apparatuses.

A CMOS image sensor has a floating diffusion (FD) amplifier having a photodiode (photoelectric conversion element) and an FD layer (FD) for each pixel. Reading is performed by selecting a certain row in a pixel array and simultaneously reading out the pixels in a column direction, that is, a column parallel output type is the mainstream.

Further, various circuits have been proposed for the pixel signal read-out (output) circuit of a column parallel output type CMOS image sensor. Among them, one of the most advanced circuits is a circuit which is provided with an analog-to-digital converter (ADC) for each column and extracts pixel signals as digital signals (for example, see Japanese Patent Publication No. 2005-276135 and Japanese Patent Publication No. 2005-295346).

In this column parallel ADC-mounting CMOS image sensor (column AD system CMOS image sensor), a comparator compares a so-called RAMP wave and the pixel signals and performs digital CDS by a later stage counter to thereby perform AD conversion.

In this type of CMOS image sensor, however, while high speed transfer of signals is possible, there is the disadvantage that a global shutter reading operation cannot be carried out.

Contrary to this, a digital pixel sensor in which an ADC including a comparator (and further a memory part) is arranged in each pixel to also enable realization of a global shutter for executing the start of exposure and end of exposure at the sane timings with respect to all pixels in the pixel array has been proposed (for example, see U.S. Pat. No. 7,164,114, B2, FIG. 4 and US Patent No. 2010/0181464, A1).

Technical Problem

In this regard, however, in the CMOS image sensors provided with the conventional digital pixel sensors explained above, it is possible to realize a global shutter function, but for example charges overflowing from the photodiodes in the integration period are not utilized in real time, therefore there is a limit to achievement of a broader dynamic range and higher frame rate.

Further, important performance indexes of CMOS image sensors include random noise. It is known that the main sources of random noise are the pixels and AD converters. In general, as techniques for reducing random noise, the methods are known of enlarging the transistor size to reduce flicker noise or of adding a capacity to the output of the comparator and lowering the bandwidth to thereby obtain a filter effect of noise by CDS. However, in each technique, there are disadvantages such as an increase in area, deterioration of inversion delay of the comparator due to the increase of capacity, and the frame rate of the imaging element not being able to be raised.

Further, since an ADC (further a memory part) including a comparator is arranged in each pixel, it is difficult to expand the effective pixel region to the maximum limit and is difficult to maximize the value relative to the cost.

Further, as methods for expanding the dynamic range, for example, the method of reading out two types of signals which are different in integration period from the same pixel in the image sensor and combining these two types of signals to thereby expand the dynamic range, the method of combining a signal having a small dynamic range in a pixel of a high sensitivity and a signal expanded in the dynamic range at a low sensitivity and to expand the dynamic range, etc. are known.

In all of the methods, a plurality of signals to be combined must be almost equally held in linearity of the output voltage with respect to each quantity of incident light (illumination) in the vicinity of the signal values for which combination (switching of signals) is carried out. Each signal is designed so that the gain with respect to the quantity of light (illumination) is different in order to expand the dynamic range (D range), therefore mainly linearities (or inclinations) are held the same in the analog-to-digital converters (ADC) by correcting gains in the digital signal processing circuits after the digital conversion.

In this regard, if for example trying to utilize the overflow charges overflowing from photodiodes in an integration period (exposure period) in an CMOS image sensor provided with digital pixel sensors, even in this integration period, an inversion timing of the comparator fluctuates upon receipt of the influence of a dark current of the floating diffusion FD as the output node and its shot noise. For this reason, there are the disadvantages such as occurrence of erroneous judgment of the comparator and an insensitive input range and occurrence of non-linearity in offset of images in the entire column, that is, fixed pattern noise (FPN), and in the AC conversion transfer curve.

It is difficult to separate the charge of the dark current of the floating diffusion FD from an actual overflow charge, therefore a joining gap (AD conversion code gap) is generated at joining points of a high light side AC conversion transfer curve and a low light side AD conversion transfer curve to be joined (boundary of AD conversion codes), so sometimes the linearity is not always guaranteed in a switching region. In such a case, there are the disadvantages that smooth switching becomes impossible, discontinuous points by that become noise, and this becomes a cause of so-called tone jump or other image deterioration.

SUMMARY

The present invention provides a solid-state imaging device capable of suppressing an influence of the dark current of a floating diffusion as an output node and capable of suppressing deterioration of the image while substantially realizing a broader dynamic range and a higher frame rate, a method for driving such a solid-state imaging device, and an electronic apparatus. Further, the present invention provides a solid-state imaging device capable of suppressing an influence of the dark current of a floating diffusion as an output node, capable of suppressing deterioration of the mage while substantially realizing a broader dynamic range and a higher frame rate, and in addition capable of lowering noise, capable of expanding the effective pixel region to the maximum limit, and capable of raising the value relative to the cost to the maximum limit, a method for driving such a solid-state imaging device, and an electronic apparatus.

Solution to Problem

A solid-state imaging device of a first aspect of the present invention has a pixel part in which pixels for performing photoelectric conversion are arranged and a reading part which reads out pixel signals from the pixels in the pixel part, wherein each of the pixels includes a photoelectric conversion element which accumulates a charge generated by photoelectric conversion in an integration period, a transfer element capable of transferring the charge accumulated in the photoelectric conversion element in a transfer period after the integration period, an output node formed by a floating diffusion to which the charge accumulated in the photoelectric conversion element is transferred through the transfer element, an output buffer part which converts the charge at the output node to a voltage signal corresponding to a quantity of the charge and outputs the converted voltage signal, and a comparator which performs comparison processing comparing the voltage signal of the output buffer part and a reference voltage and outputting the digitized comparison result signal, and the comparator, under the control of the reading part, performs a first comparison processing outputting a digitized first comparison result signal with respect to the voltage signal corresponding to the overflow charge overflowing from the photoelectric conversion element to the output node in the integration period and a second comparison processing outputting a digitized second comparison result signal with respect to the voltage signal corresponding to the accumulated charge of the photoelectric conversion element transferred to the output node in the transfer period after the integration period and, in the first comparison processing, the period of the first comparison processing is divided into a plurality of sub periods and, in each of the sub periods, the comparator performs analog-to-digital (AD) conversion processing comparing the voltage signal of the output buffer part and the reference voltage and outputting the digitized comparison result signal.

A second aspect of the present invention is a method for driving a solid-state imaging device having a pixel part in which pixels for performing photoelectric conversion are arranged and a reading part which reads out the pixel signals from the pixels in the pixel part, wherein each of the pixels includes a photoelectric conversion element which accumulates a charge generated by photoelectric conversion in an integration period, a transfer element capable of transferring the charge accumulated in the photoelectric conversion element in a transfer period after the integration period, an output node formed by a floating diffusion to which the charge accumulated in the photoelectric conversion element is transferred through the transfer element, an output buffer part which converts the charge at the output node to a voltage signal corresponding to a quantity of the charge and outputs the converted voltage signal, and a comparator which performs comparison processing comparing the voltage signal of the output buffer part and the reference voltage and outputting the digitized comparison result signal, comprising, when reading out the pixel signals of the pixels, in the comparator, under the control of the reading part, performing a first comparison processing outputting a digitized first comparison result signal with respect to the voltage signal corresponding to an overflow charge overflowing from the photoelectric conversion element to the output node in the integration period and performing a second comparison processing outputting a digitized second comparison result signal with respect to the voltage signal corresponding to the accumulated charge of the photoelectric conversion element transferred to the output node in the transfer period after the integration period and, in the first comparison processing, dividing the period of the first comparison processing into a plurality of sub periods and, in each of the sub periods, performing analog-to-digital (AD) conversion processing comparing the voltage signal of the output buffer part and the reference voltage and outputting the digitized comparison result signal.

An electronic apparatus of a third aspect of the present invention has a solid-state imaging device and an optical system for forming a subject image in the solid-state imaging device, wherein the solid-state imaging device has a pixel part in which pixels for performing photoelectric conversion are arranged and a reading part which reads out pixel signals from the pixels in the pixel part, each of the pixels includes a photoelectric conversion element which accumulates a charge generated by photoelectric conversion in an integration period, a transfer element capable of transferring the charge accumulated in the photoelectric conversion element in a transfer period after the integration period, an output node formed by a floating diffusion to which the charge accumulated in the photoelectric conversion element is transferred through the transfer element, an output buffer part which converts the charge at the output node to a voltage signal corresponding to a quantity of the charge and outputs the converted voltage signal, and a comparator which performs comparison processing comparing the voltage signal of the output buffer part and a reference voltage and outputting the digitized comparison result signal, and the comparator, under the control of the reading part, performs a first comparison processing outputting a digitized first comparison result signal with respect to the voltage signal corresponding to an overflow charge overflowing from the photoelectric conversion element to the output node in the integration period and a second comparison processing outputting a digitized second comparison result signal with respect to the voltage signal corresponding to the accumulated charge of the photoelectric conversion element transferred to the output node in the transfer period after the integration period and, in the first comparison processing, the period of the first comparison processing is divided into a plurality of sub periods and, in each of the sub periods, the comparator performs analog-to-digital (AD) conversion processing comparing the voltage signal of the output buffer part and the reference voltage and outputting the digitized comparison result signal.

Advantageous Effects of Invention

According to the present invention, it is possible to suppress the influence of the dark current of a floating diffusion as an output node and it becomes possible to suppress deterioration of the image while substantially realizing a broader dynamic range and a higher frame rate and, in addition, is possible to lower noise and expand the effective pixel region to the maximum limit and possible to raise the value relative to the cost to the maximum limit.

BRIEF DESCRIPTION OF DRAWINGS

FIG. 14A and FIG. 14B are schematic views for explaining a stacked structure of the solid-state imaging device according to the first embodiment.

DESCRIPTION OF EMBODIMENTS

Embodiments of the present invention will be hereinafter explained with reference to the drawings.

First Embodiment

Figure 1:
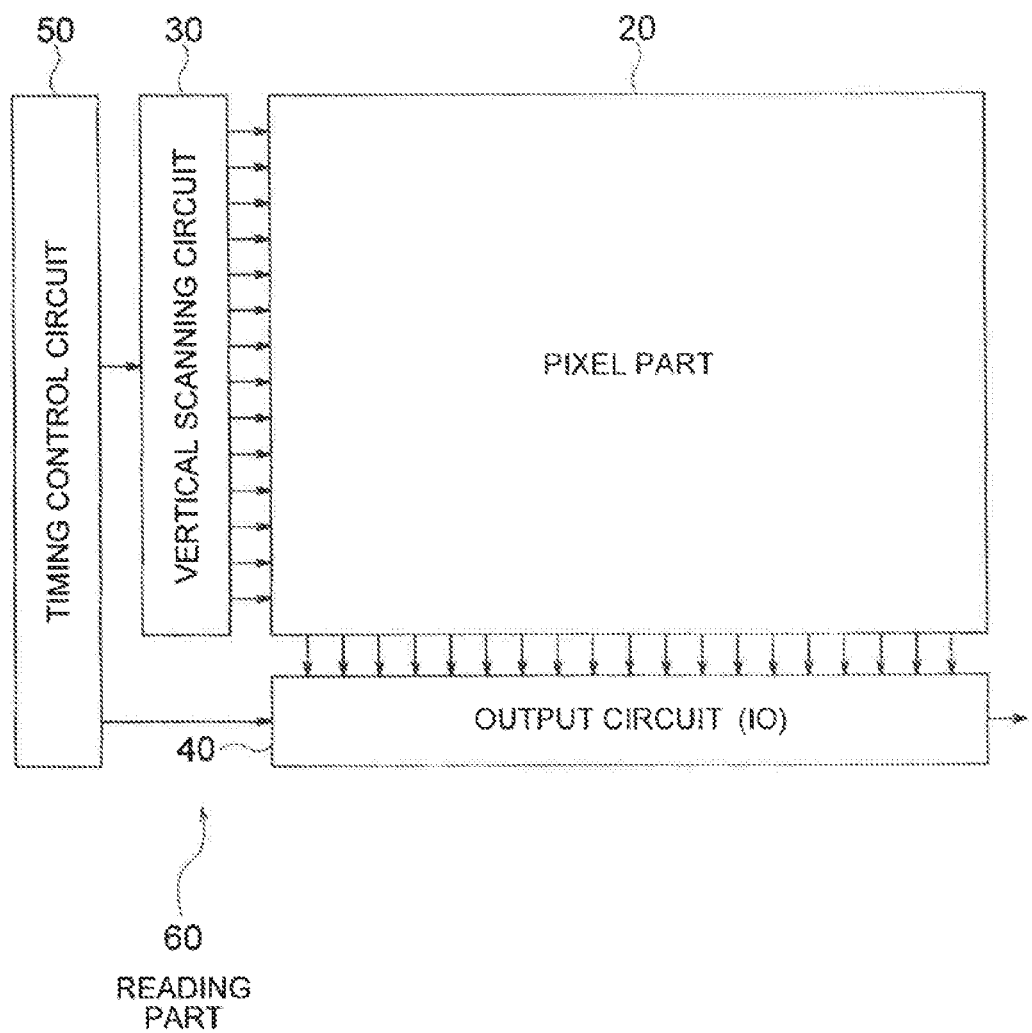
FIG. 1 is a block diagram showing an example of the configuration of a solid-state imaging device according to a first embodiment of the present invention.

FIG. 1 is a block diagram showing an example of the configuration of a solid-state imaging device according to a first embodiment of the present invention. In the present embodiment, a solid-state imaging device 10 is constituted by for example a CMOS image sensor including digital pixels as the pixels.

As shown in FIG. 1, the solid-state imaging device 10 has is constituted mainly by an image capturing part constituted by a pixel part 20, a vertical scanning circuit (row scanning circuit) 30, an output circuit 40, and a timing control circuit 50. Among these components, for example, the vertical scanning circuit 30, the output circuit 40, and the timing control circuit 50 constitute the reading part 60 for reading out pixel signals.

In the first embodiment, the solid-state imaging device 10 is configured as for example a stacked type CMOS image sensor which, in the pixel part 20, includes digital pixels comprised of photoelectric converting and reading parts, AD (analog-to-digital) conversion parts, and memory parts and has a global shutter operation function. In the solid-state imaging device 10 according to the first embodiment, as will be explained in detail later, each digital pixel DP has an AD conversion function, while the AD conversion part has a comparator performing comparison processing for comparing a voltage signal read out by the photoelectric converting and reading part and a reference voltage and outputting a digitized comparison result signal. The comparator, under the control of the reading part 60, performs a first comparison processing for outputting a digitized first comparison result signal with respect to a voltage signal corresponding to an overflow charge overflowing from the photoelectric conversion element to the output node (floating diffusion) in an integration period and a second comparison processing for outputting a digitized second comparison result signal with respect to a voltage signal corresponding to the accumulated charge of the photoelectric conversion element transferred to the output node in a transfer period after the integration period.

Further, in the first embodiment, in the first comparison processing, in order to suppress or cancel the influence of the dark current of the floating diffusion FD1 forming the output node, the period of the first comparison processing is divided into a plurality of sub periods and, in each of the sub periods, analog-to-digital (AD) conversion processing for comparing the voltage signal of the output buffer part and the reference voltage and outputting the digitized comparison result signal is carried out. The reading part 60, in each of the plurality of sub periods, resets at least the floating diffusion FD1 forming the output node to a reset level, and then performs an AD conversion processing comparing the voltage signal of the output buffer part and the reference voltage. More specifically, the reading part 60, in each of the plurality of sub periods, repeatedly executes the AD conversion processing for comparing the voltage signal of the output buffer part and a ramp shaped sub reference voltage from resetting of at least the floating diffusion FD1 forming the output node to the reset level up to the end of each sub period. The specific AD conversion processing in the first comparison processing period and the like will be explained in detail later.

Below, an outline of the configurations and functions of the parts in the solid-state imaging device 10, particularly the configurations and functions of the pixel part 20 and digital pixel, the read-out processing concerned with them, the stacked structure of the pixel part 20 and the reading part 60, and the AD conversion processing etc. in the first comparison processing period will be explained in detail.

Figure 2:
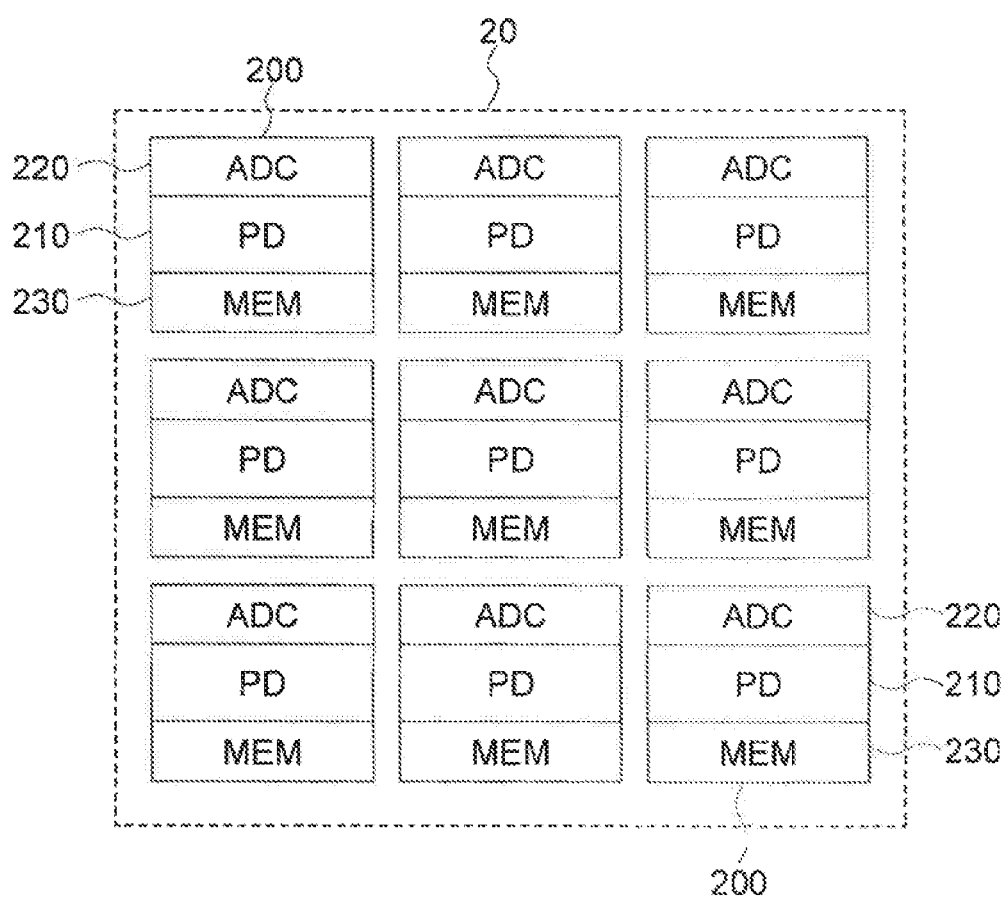
FIG. 2 is a view showing an example of a digital pixel array of a pixel part in the solid-state imaging device according to the first embodiment of the present invention.
Figure 3:
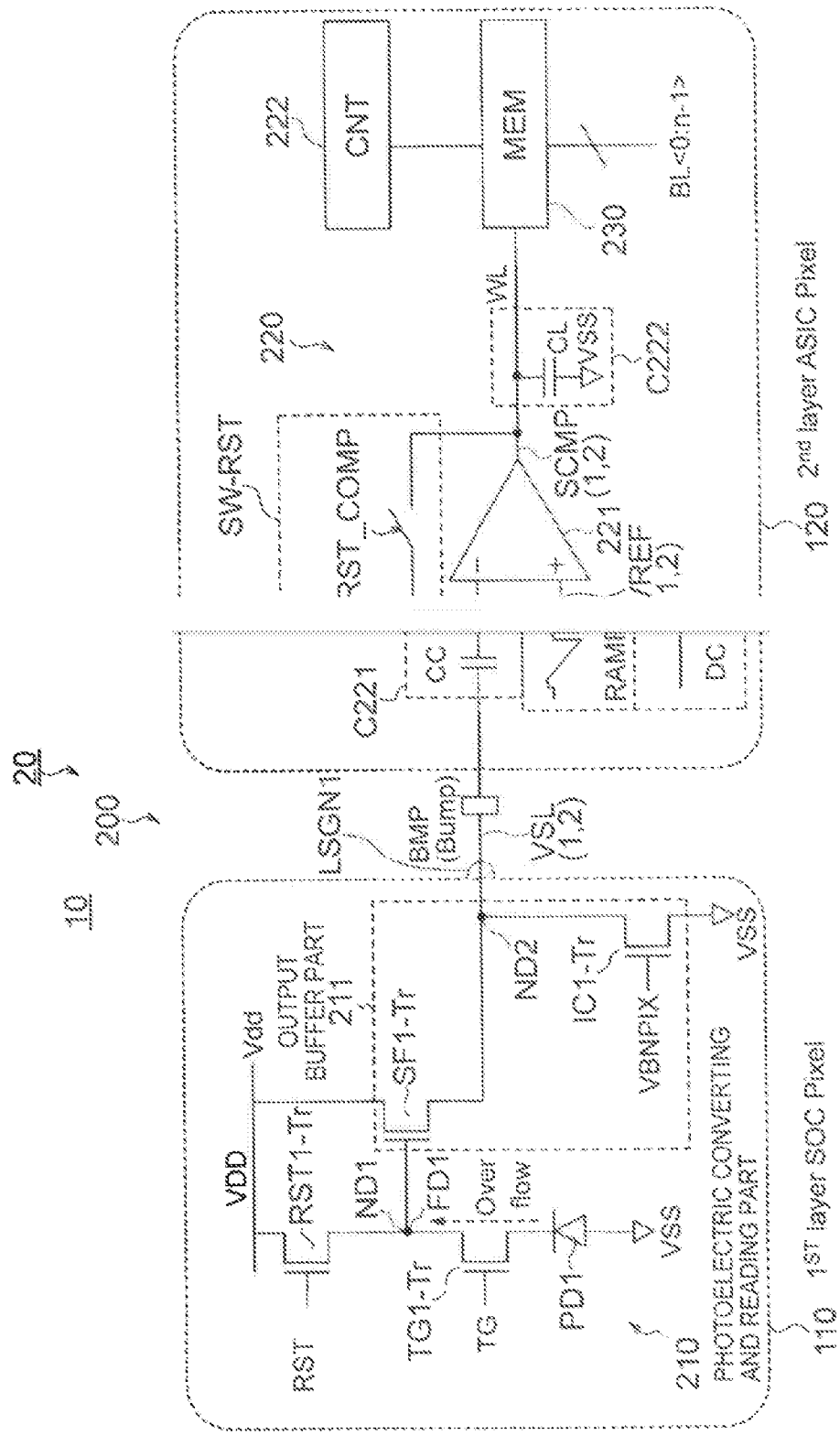
FIG. 3 is a circuit diagram showing an example of a pixel in the solid-state imaging device according to the first embodiment of the present invention.

Configurations of Pixel Part 20 and Digital Pixel 200 FIG. 2 is a view showing an example of a digital pixel array in a pixel part of the solid-state imaging device 10 according to the first embodiment of the present invention. FIG. 3 is a circuit diagram showing an example of a pixel of the solid-state imaging device 10 according to the first embodiment of the present invention.

In the pixel part 20, as shown in FIG. 2, a plurality of digital pixels 200 are arranged in a matrix comprised of N rows and M columns. Note that, for simplification of the drawing, FIG. 2 shows an example in which nine digital pixels 200 are arranged in a matrix comprised of 3 rows and 3 columns (matrix where M=3 and N=3).

The digital pixel 200 according to the first embodiment includes a photoelectric converting and reading part (denoted as PD in FIG. 2) 210, AD conversion part (denoted as ADC in FIG. 2) 220, and memory part (denoted as MEM in FIG. 2) 230. The pixel part 20 in the first embodiment, as will be explained in detail later, is configured as a laminated CMOS image sensor configured by a first substrate 110 and a second substrate 120. In the present example, as shown in FIG. 3, the photoelectric converting and reading part 210 is formed on the first substrate 110, and the AD conversion part 220 and the memory part 230 are formed on the second substrate 120.

The photoelectric converting and reading part 210 in the digital pixel 200 includes a photodiode (photoelectric conversion element) and an in-pixel amplifier. Specifically, this photoelectric converting and reading part 210 has for example a photodiode PD1 as a photoelectric conversion element. This photodiode PD1 has one each of a transfer transistor TG1-Tr as a transfer element, a reset transistor RST1-Tr as a reset element, a source follower transistor SF1-Tr as a source follower element, a current transistor IC1-Tr as a current source element, a floating diffusion FD1 as an output node ND1, and a read-out node ND2. In this way, the photoelectric converting and reading part 210 in the digital pixel 200 according to the first embodiment includes the four transistors (4Tr) of the transfer transistor TG1-Tr, the reset transistor RST1-Tr, the source follower transistor SF1-Tr, and the current transistor IC1-Tr.

Further, in the first embodiment, an output buffer part 211 includes the source follower transistor SF1-Tr, current transistor IC1-Tr, and read-out node ND2.

In the photoelectric converting and reading part 210 according to the first embodiment, the read-out node ND2 of the output buffer part 211 is connected to the input part of the AD conversion part 220. The photoelectric converting and reading part 210 converts the charge in the floating diffusion FD1 as the output node to a voltage signal corresponding to the quantity of charge and outputs the converted voltage signal VSL to the AD conversion part 220.

More specifically, in the first comparison processing period PCMPR1 of the AD conversion part 220, the photoelectric converting and reading part 210 outputs the voltage signal VSL corresponding to the overflow charge overflowing from the photodiode PD1 as the photoelectric conversion element to the floating diffusion FD1 as the output node in the integration period PI.

Further, in the second comparison processing period PCMPR2 of the AD conversion part 220, the photoelectric converting and reading part 210 outputs the voltage signal VSL corresponding to the accumulated charge of the photodiode PD1 transferred to the floating diffusion FD1 as the output node in the transfer period PT after the integration period PI. In the second comparison processing period PCMPR2, the photoelectric converting and reading part 210 outputs the read-out reset signal (signal voltage) (VRST) and read-out signal (signal voltage) (VSIG) as pixel signals to the AD conversion part 220.

The photodiode PD1 generates a signal charge (here, electrons) in an amount in accordance with the quantity of the incident light and accumulates the same. Below, an explanation will be given of a case where the signal charge is electrons and each transistor is an n-type transistor. However, the signal charge may be positive holes (holes) or each transistor may be a p-type transistor as well. Further, the present embodiment is effective also in a case where each transistor is shared among a plurality of photodiodes and transfer transistors.

In each digital pixel 200, the photodiode (PD) is constituted by a pinned photodiode (PPD). On the substrate surface for forming the photodiode (PD), there is a surface level due to dangling bonds or other defects, therefore a lot of charges (dark current) are generated due to heat energy, so a correct signal fails to be read out. In a pinned photodiode (PPD), the charge accumulation part of the photodiode (PD) is pinned in the substrate, so it becomes possible to reduce mixing dark current into the signal.

The transfer transistor TG1-Tr in the photoelectric converting and reading part 210 is connected between the photodiode PD1 and the floating diffusion FD1 and is controlled by a control signal TG applied through a control line to the gate. The transfer transistor TG1-Tr is selected and enters a conductive state in the transfer period PT in which the control signal TC is at a high (H) level. It transfers the charge (electrons) which is photo-electrically converted and accumulated in the photodiode PD1 to the floating diffusion FD1. Note that, after the photodiode PD1 and floating diffusion FD1 are reset to the predetermined reset potentials, the transfer transistor TG1-Tr enters a non-conductive state in which the control signal TC is at a low (L) level, and the photodiode PD1 enters into the integration period PI. However, at this time, if the intensity (quantity) of the incident light is very high, the charge exceeding the saturated charge amount overflows to the floating diffusion FD1 as the overflow charge through the overflow path under the transfer transistor TG1-Tr.

The reset transistor RST1-Tr is connected between the power supply line Vdd of the power supply voltage VDD and the floating diffusion FD1 and is controlled by the control signal PST supplied through the control line to the gate. The reset transistor RST1-Tr is selected and enters a conductive state in the reset period in which the control signal RST is at the H Level and resets the floating diffusion FD1 to the potential of the power supply line Vdd of the power supply voltage VDD.

The source follower transistor SF1-Tr as the source follower element is connected at the source to the read-out node ND2, is connected at the drain side to the power supply line Vdd, and is connected at the gate to the floating diffusion FD1. The drain and source of the current transistor IC1-Tr as the current source element are connected between the read-out node ND2 and the reference potential VSS (for example GND). The gate of the current transistor IC1-Tr is connected to a supply line of a control signal VBNPIX. Further, a signal line LSGN1 between the read-out node ND2 and the input part of the AD conversion part 220 is driven by the current transistor IC1-Tr as the current source element.

Figure 4:
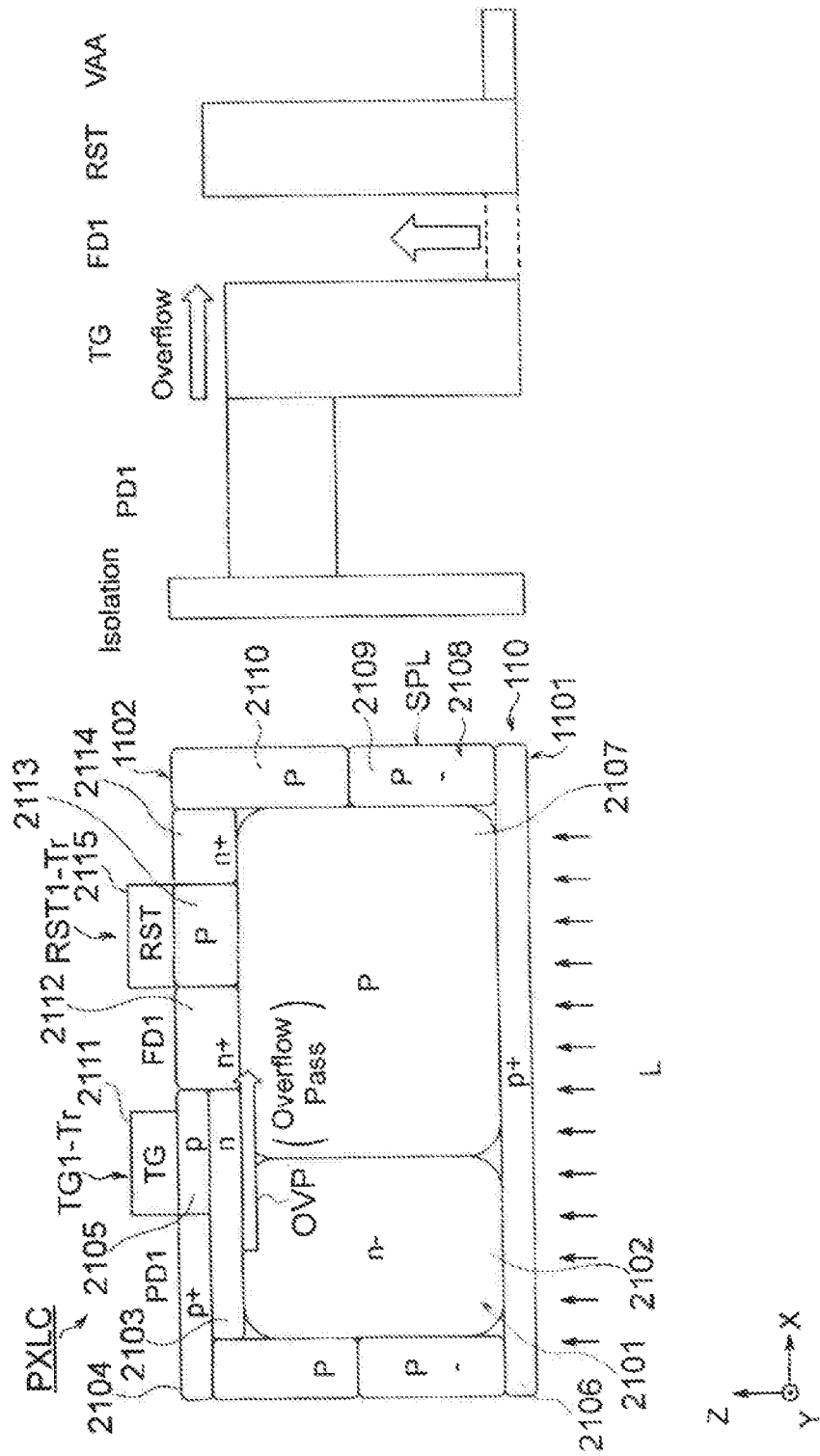
FIG. 4A and FIG. 4B are simple cross-sectional views showing an example of the configuration of a principal part of the digital pixel according to the first embodiment of the present invention, that is, a charge integration and transfer system, and a potential diagram at the time of overflowing.

FIG. 4A and FIG. 4B are schematic cross-sectional views showing an example of the configuration of the principal part of a digital pixel according to the first embodiment of the present invention, that is, the charge integration and transfer system, and a potential diagram at the time of overflowing.

Each digital pixel cell PXLC is formed on a semiconductor substrate (first substrate 110 in the present example) having a first substrate surface 1101 side to which the light L is irradiated (for example back surface side) and a second substrate surface 1102 side on the side opposite to this first substrate surface 1101 side and is separated by separation layers SPL. Further, the digital pixel cell PLXC in FIG. 4A includes parts forming the photoelectric converting and reading part 210 such as the photodiode PD1, the transfer transistor TG1-Tr, the floating diffusion FD1, the reset transistor RST1-Tr, the separation layers SPL, and further a color filter part and a micro-lens (not shown).

Configuration of Photodiode

The photodiode PD1 includes a semiconductor layer (n-layer in the present embodiment) 2101 of a first conductivity type (n-type in the present embodiment) formed so as to be pinned in the semiconductor substrate having the first substrate surface 1101 side and the second substrate surface 1102 side on the side opposite to the first substrate surface 1101 side and is formed so as to have a photoelectric conversion function of the received light and charge accumulation function. In the side portions of the photodiode PD1 in a direction (X-direction in an orthogonal coordinate system in the drawing) perpendicular to the normal line of the substrate, second conductivity type (p-type in the present embodiment) separation layers SPL are formed.

In this way, in the present embodiment, in each digital pixel cell PXLC, as the photodiode (PD), use is made of a pinned photodiode (PPD). On the substrate surface for forming the photodiode (PD), there is a surface level due to dangling bonds or another defects, therefore a lot of charges (dark current) are generated due to heat energy, so a correct signal ends up being unable to be readout. In a pinned photodiode (PPD), the charge accumulation part of the photodiode (PD) is pinned in the substrate, so it becomes possible to reduce mixing the dark current into the signal.

In the photodiode PD1 in FIG. 4A, the n-layer (first conductivity type semiconductor layer) 2101 is configured so as to have a two-layer structure in the normal line direction of the substrate 110 (Z-direction in the orthogonal coordinate system in the drawing). In the present example, an $n^-$-layer 2102 is formed on the first substrate surface 1101 side, an n-layer 2103 is formed on the second substrate surface 1102 side of this $n^-$-layer 2102, and $p^+$-layer 2104 and p-layer 2105 are formed on the second substrate surface 1102 side of this n-layer 2103. Further, a $p^+$-layer 2106 is formed on the first substrate surface 1101 side of the $n^-$-layer 2102. The $p^+$-layer 2106 is formed uniformly covering not only the photodiode PD1, but also the separation layers SPL and further other digital pixel cells PXLC.

Note that, on the light incident side of this $p^+$-layer 2106, a color filter part is formed. Further, a micro-lens is formed on the light incident side of the color filter part so as to correspond to a portion of the photodiode PD1 and separation layers SPL.

These configurations are one example. The structure may be a single layer structure or may be a three-layer, four-layer, or higher stacked structure.

Configuration of Separation Layers in X-Direction (Column Direction)

In a p-type separation layer SPL in the X-direction (column direction) in FIG. 4A, a first p-layer (second conductivity type semiconductor layer) 2107 is formed on the side contacting the $n^-$-layer 2102 of the photodiode PD1 and at the right side part in the direction (X-direction in the orthogonal coordinate system in the drawing) perpendicular to the normal line of the substrate. Further, in a p-type separation layer SPL, on the right side in the X-direction of the first p-layer 2107, a second p-layer (second conductivity type semiconductor layer) 2108 is formed so as to give a two-layer structure in the normal line direction of the substrate 110 (Z-direction in the orthogonal coordinate system in the drawing). In the present example, in the second p-layer 2108, a $p^-$-layer 2109 is formed on the first substrate surface 1101 side, while a p-layer 2110 is formed on the second substrate surface 1102 side of this $p^-$-layer 2109.

These configurations are one example. The structure may be a single layer structure or may be a three-layer, four-layer, or higher stacked structure.

On the first substrate surface 1101 side of the first p-layer 2107 and the second $p^-$-layer 2109 in the p-type separation layer SPL, a $p^+$-layer 2106 the same as the photodiode PD1 is formed.

An n-layer 2103 is formed so as to extend so that an overflow path OVP is formed covering a portion on the second substrate surface 1102 side of the first p-layer 2107 in the p-type separation layer SPL. Further, on the p-layer 2105 on the second substrate surface 1102 side of the n-layer 2103, a gate electrode 2111 of the transfer transistor TG1-Tr is formed through a gate insulation film. Further, on the second substrate surface 1102 side of the first p-layer 2107 in the p-type separation layer SPL, an $n^+$-layer 2112 for forming the floating diffusion FD1 is formed. A p-layer 2113 for forming the channel-forming region of the reset transistor RST1-Tr is formed adjacent to the $n^+$-layer 2112 while an $n^+$-layer 2114 is formed adjacent to the p-layer 2113. Further, on the p-layer 2113, a gate electrode 2115 is formed through a gate insulation film.

In such a structure, if the intensity (quantity) of the incident light is very high, a charge exceeding the saturated charge amount overflows as the overflow charge to the floating diffusion FD1 through the overflow path OVP under the transfer transistor TG1-Tr.

The AD conversion part 220 in the digital pixel 200 has a function of comparing the analog voltage signal VSL output by the photoelectric converting and reading part 210 with a reference voltage VREF of a ramp waveform changed with a predetermined inclination or of a fixed voltage and converting the result to a digital signal.

The AD conversion part 220, as shown in FIG. 3, is configured including a comparator (COMP) 221, a counter (CNT) 222, an input side coupling capacitor C221, an output side load capacitor C222, and a reset switch SW-RST.

In the comparator 221, the inverted input terminal (−) as the first input terminal is supplied with the voltage signal VSL which was output from the output buffer part 211 of the photoelectric converting and reading part 210 to the signal line LSGN1, while the non-inverted input terminal (+) as the second input terminal is supplied with the reference voltage VREF. The comparator performs comparison processing comparing the voltage signal VSL and the reference voltage VREF and outputting the digitized comparison result signal SCMP.

In the comparator 221, the coupling capacitor C221 is connected to the inverted input terminal (−) as the first input terminal. By AC-coupling of the output buffer part 211 of the photoelectric converting and reading part 210 on the first substrate 110 side and the input part of the comparator 221 in the AD conversion part 220 on the second substrate 120 side, it is possible to lower noise and to realize a high SNR at the time of low light.

Further, in the comparator 221, the reset switch SW-RST is connected between the output terminal and the inverted input terminal (−) as the first input terminal, while the load capacitor C222 is connected between the output terminal and the reference potential VSS.

Basically, in the AD conversion part 220, the analog signal (potential VSL) read out from the output buffer part 211 of the photoelectric converting and reading part 210 to the signal line LSGN1 is compared in the comparator 221 with the reference voltage VREF, for example, a ramp signal RAMP with a slope waveform linearly or non-linearly changing with a certain inclination. At this time, a counter 222 which is arranged for each column in the same way as the comparator 221 is operating. Therefore, by the ramp signal RAMP with the ramp waveform and the counter value changing in one-to-one correspondence, the voltage signal VSL is converted to a digital signal. Basically, in the AD conversion part 220, the change of the reference voltage VREF (for example ramp signal RAMP) is conversion of a change of voltage to a change of time. By counting that time in certain cycle (clock), it is converted to a digital value. Further, where the analog signal VSL and the ramp signal RAMP (reference voltage VREF) cross, the output of the comparator 221 inverts and the input clock of the counter 222 is stopped or the clock stopped being input is input to the counter 222. The value (data) of the counter 222 at that time is stored in the memory part 230 to thereby complete the AD conversion. After the end of the above AD conversion period, the data (signal) stored in the memory part 230 in each digital pixel 200 is output from the output circuit 40 to a not shown signal processing circuit, whereupon a two-dimensional image is generated by predetermined signal processing.

Basic First Comparison Processing and Second Comparison Processing in Comparator 221

Further, the comparator 221 in the AD conversion part 220 in the first embodiment is controlled in drive by the reading part 60 so as to perform the following two processings, i.e., the first comparison processing and the second comparison processing, in the reading period of pixel signals.

In the first comparison processing CMPR1, under the control of the reading part 60, the comparator 221 outputs a digitized first comparison result signal SCMP1 with respect to a voltage signal VSL1 corresponding to the overflow charge overflowing from the photodiode PD1 as the photoelectric conversion element to the floating diffusion FD1 as the output node in the integration period PI. Note that, the operation of this first comparison processing CMPR1 is also referred to as a "time stamp (TS) ADC mode operation".

In the second comparison processing CMPR2, under the control of the reading part 60, the comparator 221 outputs a digitized second comparison result signal SCMP2 with respect to a voltage signal VSL2 (VSIG) corresponding to the accumulated charge of the photodiode PD1 transferred to the floating diffusion FD1 as the output node in the transfer period PT after the integration period PI. In actuality, in the second comparison processing CMPR2, before the voltage signal VSL2 (VSIG) corresponding to the accumulated charge is digitized, the voltage signal VSL2 (VRST) corresponding to the reset voltage of the floating diffusion FD1 at the time of resetting is digitized. Note that, the operation of this second comparison processing CMPR2 is also referred to as a "linear (Lin) ADC mode operation".

Note that, in the present embodiment, basically the integration period PI is the period from when the photodiode PD1 and floating diffusion FD1 are reset to the reset level to when the transfer transistor TG1-Tr is switched to a conductive state and the transfer period PT is started. The period PCMPR1 of the first comparison processing CMPR1 is the period after the start of resetting of the photodiode PD1 and floating diffusion FD1 to the reset level up to when the floating diffusion FD1 is reset to the reset level before the start of the transfer period PT. The period PCMPR2 of the second comparison processing CMPR2 is the period after the reset of the floating diffusion FD1 to the reset level and is the period including the transfer period PT aid following period.

Figure 5:
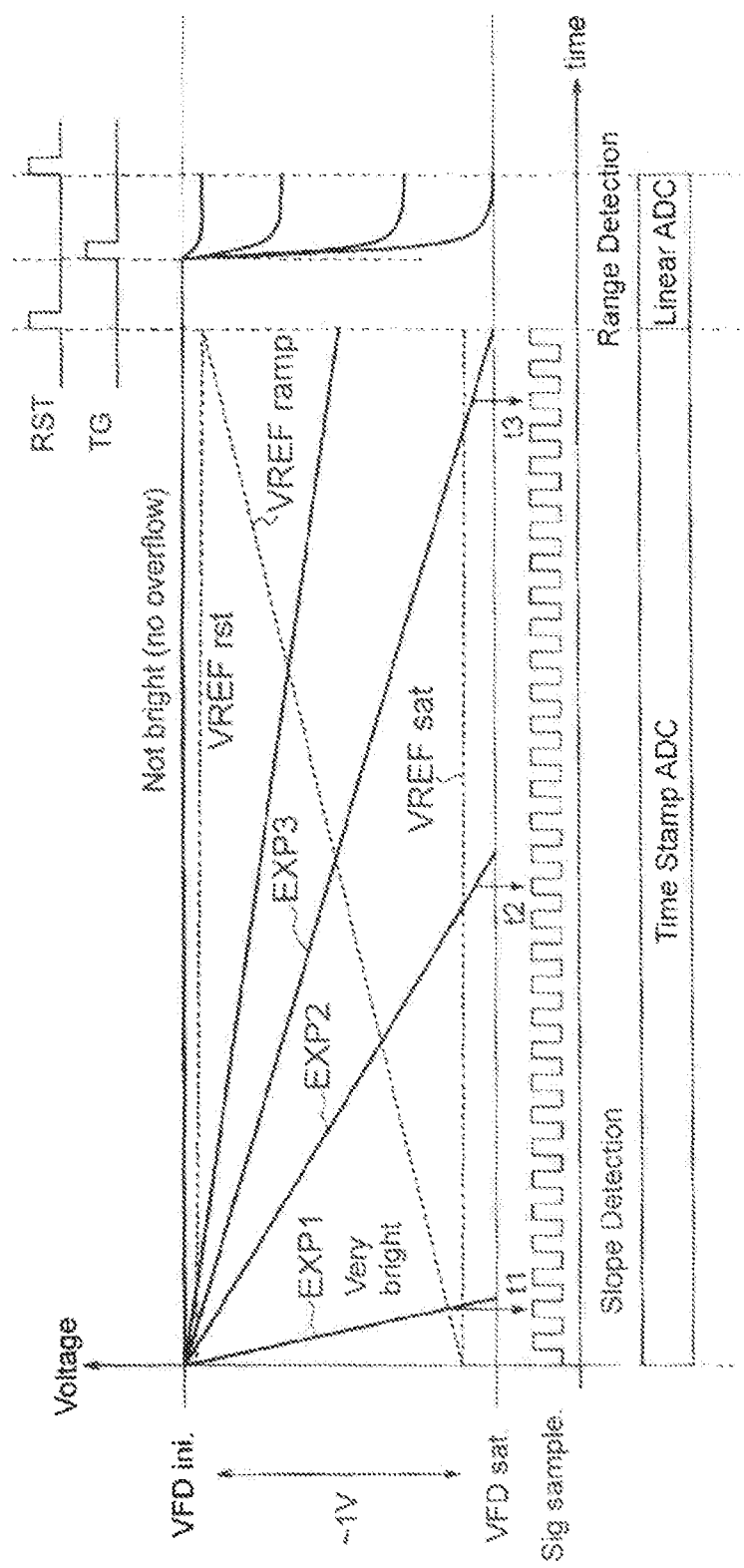
FIG. 5 is a view for explaining a basic first comparison processing of a comparator according to the embodiment.

Here, the basic first comparison processing CMPR1 will be further explained in detail. FIG. 5 is a view for explaining the basic first comparison processing CMPR1 of the comparator 221 according to the present embodiment. In FIG. 5, an abscissa indicates the time, and an ordinate indicates the voltage level VFD of the floating diffusion FD1 as the output node.

Looking at the voltage level VFD of the floating diffusion FD1, at the time of the reset level, the quantity of charge is the smallest and the voltage level VFD becomes the highest level VFDini. On the other hand, at the time of the saturation state, the quantity of charge is the largest and the voltage level VFD becomes a low level VFDsat. According to such conditions, the reference voltage VREF1 of the comparator 221 is set to a voltage VREFsat which is fixed to the level at the time of the non-saturation state before the saturation state or is set to a ramp voltage VREFramp changing from a voltage level VREFrst at the time of reset level up to the voltage level VREFsat.

If such a reference voltage VREF1 is set at VREFsat or VREFramp at the time of the first comparison processing CMPR1, as shown in FIG. 5, at the time of high light when the intensity of the incident light is high, the quantity of charge is larger, therefore the time of flipping (inversion) of the output of the comparator 221 is fast. In a case of example EXP1 of the highest light, the output of the comparator 221 immediately flips (inverts) at the time t1. In a case of example EXP2 of light lower than that in example EXP1, the output of the comparator 221 flips (inverts) at the time t2 Later than the time t1. In a case of example EXP3 of a light lower than that in example EXP2, the output of the comparator 221 flips (inverts) at the time t3 later than the time t2.

In this way, in the first comparison processing CMPR1, the comparator 221 outputs the first comparison result signal SCMP1 with respect to the time corresponding to the quantity of overflow charge from the photodiode PD1 to the floating diffusion FD1 for a predetermined time period in the integration period PI.

More specifically, in the first comparison processing CMPR1, the comparator 221 can handle comparison processing with a light level from a signal level corresponding to a predetermined threshold value of the photodiode PD1 at the maximum sampling time at which the overflow charge begins to overflow from the photodiode PD1 to the floating diffusion FD1 as the output node to the signal level obtained at the minimum sampling time.

As explained above, the photo conversion operation in the time stamp ADC mode is executed in the integration period PI accompanied by light-to-time conversion. As shown in FIG. 5, under a very bright light, the output state of the comparator 221 is inverted immediately after the reset activation period, and the light level thereof corresponds to the saturation signal (well capacity) explained by the following time:

((FD saturation amount×integration time)/sampling period)+PD saturation amount

For example, assume that FD saturation: 8 Ke@150 uV/e to 1.1 fF of FD capacity, minimum sampling time: 15 nsec, and integration time: 3 msec.

In this time stamp ADC operation mode, as explained above, it is possible to cover the light level from a signal level corresponding to the predetermined threshold value of the photodiode PD1 at the maximum sampling time at which the overflow charge begins to overflow from the photodiode PD1 to the floating diffusion FD1 as the output node to a signal level obtained at the minimum sampling time.

Figure 6:
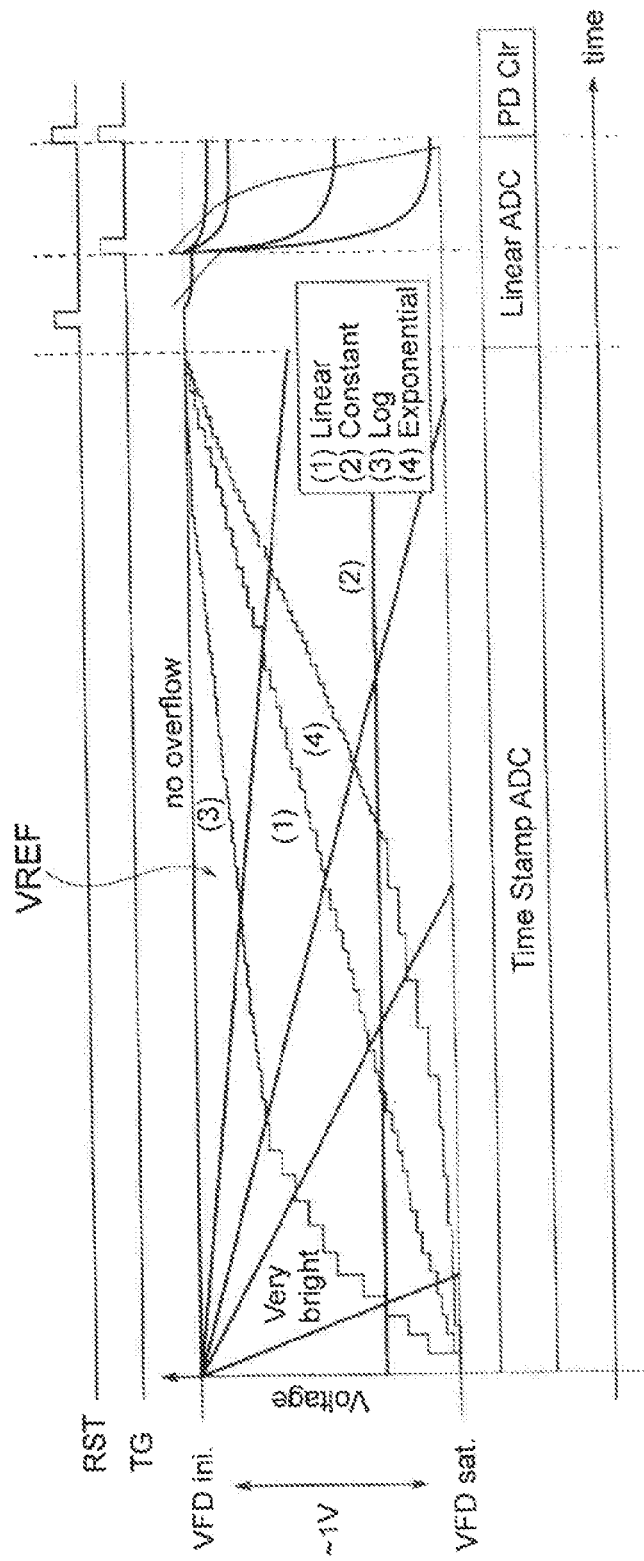
FIG. 6 is a view for explaining the basic first comparison processing of the comparator according to the embodiment, and for explaining an example of another pattern of a reference voltage.

FIG. 6 is a view for explaining the basic first comparison processing CMPR1 of the comparator 221 according to the present embodiment and explaining an example of another pattern of the reference voltage.

The reference voltage VREF may be a ramp waveform (signal) RAMP changing with a predetermined inclination as indicated by (1) in FIG. 6 or a fixed voltage DC indicated by (2) in FIG. 6 as well. Further, it may be a log indicated by (3) in FIG. 6 or a voltage signal taxing an exponential value indicated by (4) in FIG. 6 as well.

Figure 7:
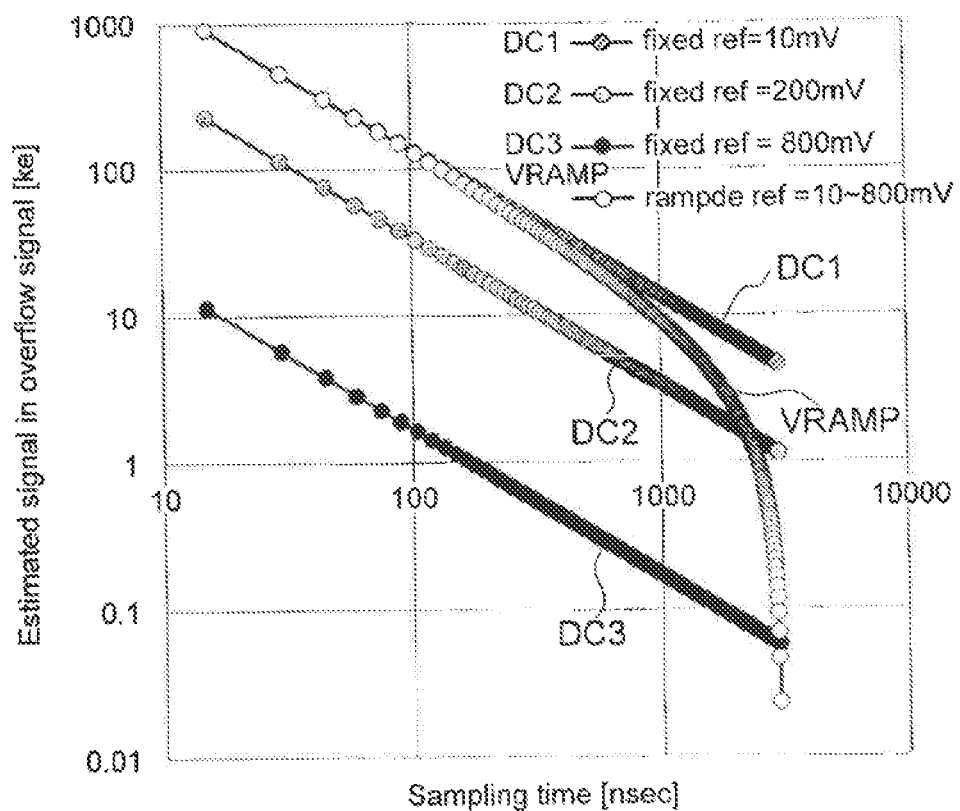
FIG. 7 is a view showing states of light-to-time conversion where various reference voltages are input to the comparator according to the embodiment.

FIG. 7 is a view showing states of light-to-time conversion where various reference voltages VREF are input to the comparator according to the present embodiment. In FIG. 7, an abscissa indicates the sampling time, and an ordinate indicates the estimated signal in the overflow signal.

FIG. 7 shows a sampling time at which the comparator 221 inverts which corresponds to the overflow charge (signal) according to the nature (suitability) of the light applied. FIG. 7 shows the sampling time which inverts for a variety of fixed reference voltages DC1, DC2, and D3 and the ramp reference voltage VRAMP. Here, use is made of a linear reference ramp.

When the operation of the time stamp ADC mode for performing the first comparison processing CMPR1 with respect to the saturated overflow charge as described above ends, after resetting the floating diffusion FD1 and comparator 221, the processing shifts to the operation of the linear ADC mode for performing the second comparison processing CMPR2 with respect to the non-saturated charge.

Figure 8:
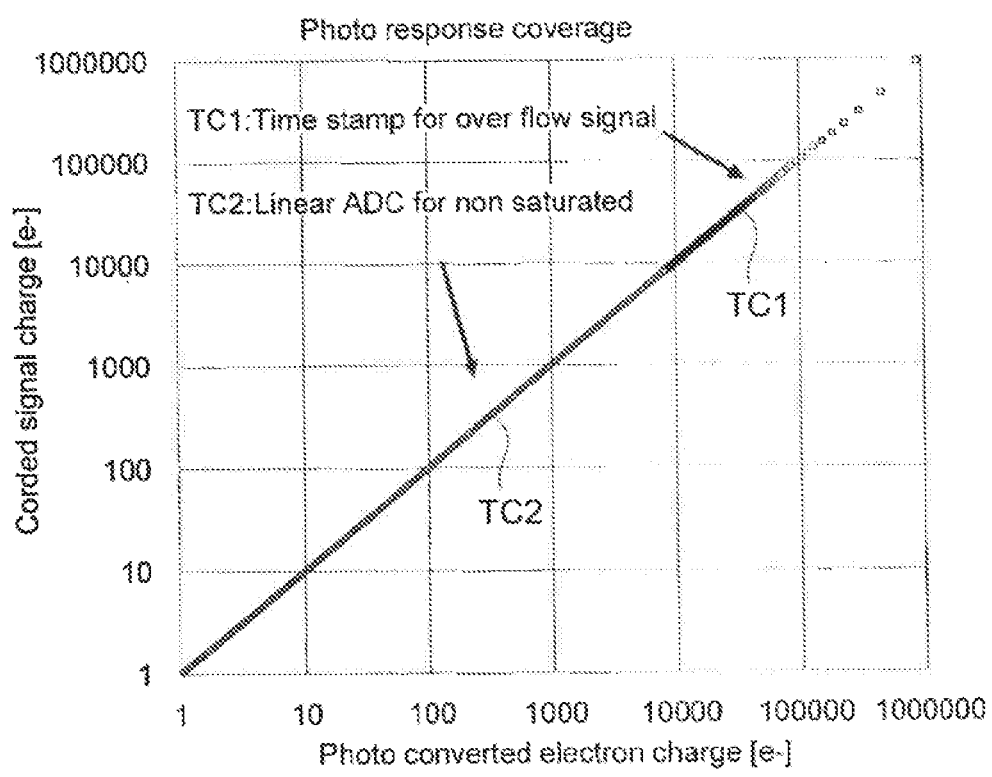
FIG. 8 is a view showing a light response coverage in the digital pixel according to the first embodiment of the present invention.

FIG. 8 is a view showing a photo response coverage in the digital pixel according to the first embodiment of the present invention. In FIG. 8, TC1 indicates the signal (AD conversion transfer curve) according to the time stamp ADC mode operation, and TC2 indicates the signal (AD conversion transfer curve) according to the linear ADC mode operation.

The time stamp ADC mode has a photo response with respect to very bright light, therefore the linear ADC mode can have a photo response from a dark level. For example, a dynamic range performance of 120 dB can be realized. For example, as explained above, the saturation signal of the photo conversion range is 900 Ke. The linear ADC mode is a usual reading mode operation to which ADC is applied, therefore can cover from a noise level of 2 e up to the saturation of the photodiode PD1 and floating diffusion FD1 of 8 Ke. The coverage of the linear ADC mode can be expanded to 30 Ke by an additional switch aid capacity.

FIG. 8 shows a case where the combinational processing of the first AD conversion transfer curve TC1 corresponding to the first comparison processing CMPR1 and the second AD conversion transfer curve TC2 corresponding to the second comparison processing CMPR2 is ideally carried out, so there is no joining gap at the joining part (joining region) of the two curves TC1 and TC2 and smooth switching (connection) is carried out.

In actuality, however, in the time stamp ADC mode, if trying to utilize the overflow charges overflowing from the photodiodes in the integration period (exposure period) in real time, even in this integration period, due to the influence of the dark current of the floating diffusion FD1 and the shot noise thereof, the inversion timing of the comparator 221 is liable to fluctuate. For this reason, erroneous judgment of the comparator and an insensitive input range are liable to occur and non-linearity in the offset of images in the entire column, that is, fixed pattern noise (FPN), and in the AC conversion transfer curve is liable to occur.

Therefore, in the present embodiment, as will be explained in detail later, in the first comparison processing, the period of the first comparison processing is divided into a plurality of sub periods and, in each of the sub periods, the analog-to-digital (AD) conversion processing comparing the voltage signal VSL of the output buffer part 211 and the reference voltage VREF and outputting the digitized comparison result signal is carried out. More specifically, the reading part 60, in each of the plurality of sub periods, repeatedly executes AD conversion processing comparing the voltage signal VSL of the output buffer part 211 and the ramp state sub reference voltage RAMP from resetting at least the floating diffusion FD1 forming the output node ND1 to the reset level up to the end of each sub period to thereby suppress or cancel the influence of the dark current of the floating diffusion FD1 forming the output node ND1 and suppress deterioration of the image while substantially realizing a broader dynamic range.

Figure 9:
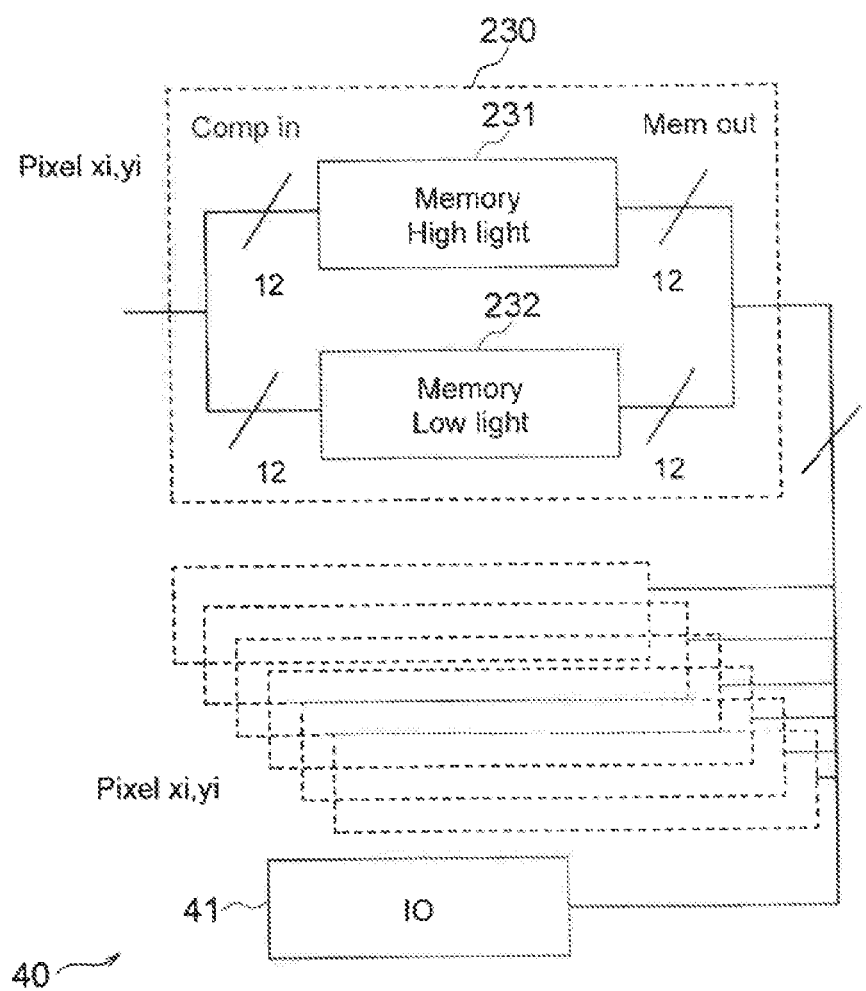
FIG. 9 is a view showing an example of configurations of a memory part and an output circuit according to the first embodiment of the present invention.

FIG. 9 is a view showing an example of the configuration of a memory part and output circuit according to the first embodiment of the present invention.

In the comparator 221, the first comparison result signal SCMP1 obtained by digitalization of the voltage signal corresponding to the overflow charge of the floating diffusion FD1 by the first comparison processing CMPR1 and the second comparison result signal SCMP2 obtained by digitalization of the accumulated charge in the photodiode PD1 by the second comparison processing CMPR2 are stored as digital data in the memories 231 and 232 linked with each other. The memory part 230 is configured by an SRAM or DRAM, and the digital-converted signal is supplied to this. The signal corresponds to the photo conversion code and can be read out by an external IO buffer 41 of the output circuit 40 on the periphery of the pixel array.

Figure 10:
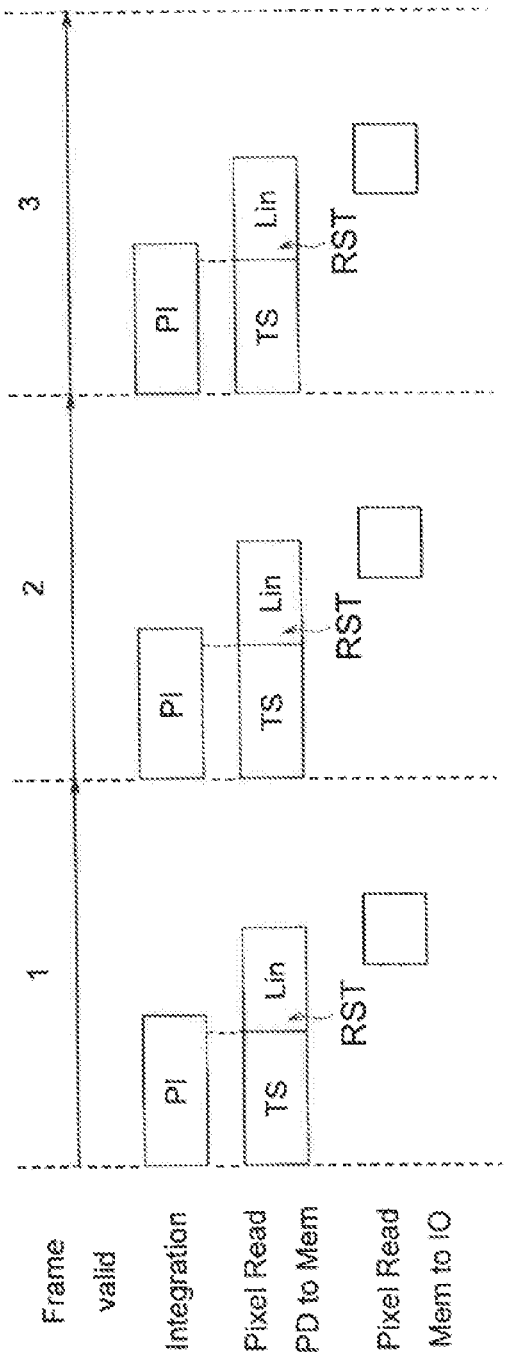
FIG. 10 is a view showing an example of a frame read out sequence in the solid-state imaging device according to the first embodiment of the present invention.

FIG. 10 is a view showing an example of the frame read out sequence in the solid-state imaging device 10 according to the first embodiment of the present invention. Here, an example of the frame read-out method in the solid-state imaging device 10 will be explained. In FIG. 10, TS indicates the processing time of the time stamp ADC, and Lin indicates the processing period of the linear ADC.

As explained above, the overflow charge is accumulated in the floating diffusion FD1 in the integration period PI. The time stamp ADC mode operates in the integration period PI. In actuality, the time stamp ADC mode operates for a period in the integration period PI up to the reset of the floating diffusion FD1. When the operation of the time stamp ADC node ends, the operation shifts to the linear ADC node where conversion is carried out so as to read the signal (VRST) at the time of reset of the floating diffusion FD1 and store the digital signal in the memory part 230. Further, after the end of the integration period PI, in the linear ADC mode, conversion is carried out so as to read the signal (VSIG) in accordance with the accumulated charge of the photodiode PD1 and store the digital signal in the memory part 230. The read-out frame is executed by reading the digital signal data from the memory node. It has an MIPI data format and is, for example, sent to the outside of the solid-state imaging device 10 (image sensor) through an IO buffer 41 of the output circuit 40 (FIG. 9). This operation can be globally executed with respect to the entire pixel array.

Further, in the pixel part 20, the reset transistors RST1-Tr and transfer transistors TG1-Tr are used to reset the photodiodes PD1 simultaneously for all of the pixels to thereby start the exposure for all of the pixels simultaneously and in parallel. Further, after the predetermined exposure period (integration period PI) ends, the transfer transistors TG1-Tr are used to sample the output signals from the photoelectric converting and reading parts 210 at the AD conversion parts 220 and memory parts 230 to thereby end the exposure simultaneously and in parallel for all pixels. Due to this, a global shutter operation is realized electronically.

The vertical scanning circuit 30 drives the photoelectric converting and reading parts 210 in the digital pixels 200 through the row scanning control line in the shutter rows and read rows under the control of the timing control circuit 50. Under the control of the timing control circuit 50, the vertical scanning circuit 30 supplies reference voltages VREF1 and VREF2 set according to the first comparison processing CMPR1 and second comparison processing CMPR2 to the comparators 221 in the digital pixels 200. Further, the vertical scanning circuit 30, according to the address signals, outputs the row selection signals of row addresses of the read row for reading of the signal and the shutter row for resetting the charges accumulated in the photodiodes PD1.

The output circuit 40, for example, as shown in FIG. 9, includes the IO buffer 41 arranged corresponding to the memory output of each digital pixel 200 in the pixel part 20 and outputs the digital data read out from each digital pixel 200 to the outside.

The timing control circuit 50 generates timing signals necessary for signal processing of the pixel part 20, the vertical scanning circuit 30, the output circuit 40, and the like.

In the first embodiment, for example, at the time of the global shutter mode, the reading part 60 performs the read-out control of the pixel signals from the digital pixels 200.

AD Conversion Processing Method in First Comparison Processing Period for Suppressing or Cancelling Influence of Dark Current of FD1 The outline of the configurations and functions of the parts in the solid-state imaging device 10, particularly the configurations and functions of the pixel part 20 and digital pixels, were explained above. Below, an AD conversion processing method in the first comparison processing period for suppressing or cancelling the influence of the dark current of the floating diffusion FD1 and the like will be explained in detail.

First, before explaining the AD conversion processing method in the first comparison processing period for suppressing or cancelling the influence of the dark current of the floating diffusion FD1 and the like, an influence of the dark current of the floating diffusion FD1 exerted upon the basic first comparison processing explained before at the time of the time stamp ADC mode will be considered.

In the comparator 221, the input range on the high light side is not limited by the linear fill well of the photodiode PD1, but is limited by the ADC clock frequency, therefore the time stamp ADC combined with the linear ADC can greatly increase the dynamic range of the digital pixel sensor architecture. This technique may become for example a promising global shutter technique in the near future.

However, the floating diffusion FD1 is used in a time stamp ADC phase, therefore erroneous judgment and an insensitive input range occur due to the dark current and shot noise of the floating diffusion FD1. In particular, this may become harmful when the exposure time must be made longer.

The dark current of the floating diffusion FD1 of a usual 3 μm pixel is about 300 el at 60° C. in 10 ms. This is believed to correspond to 60 mVrms. This fluctuation is very large compared with the about 0.3 mVrms of a comparator reset noise fluctuation.

Figure 11:
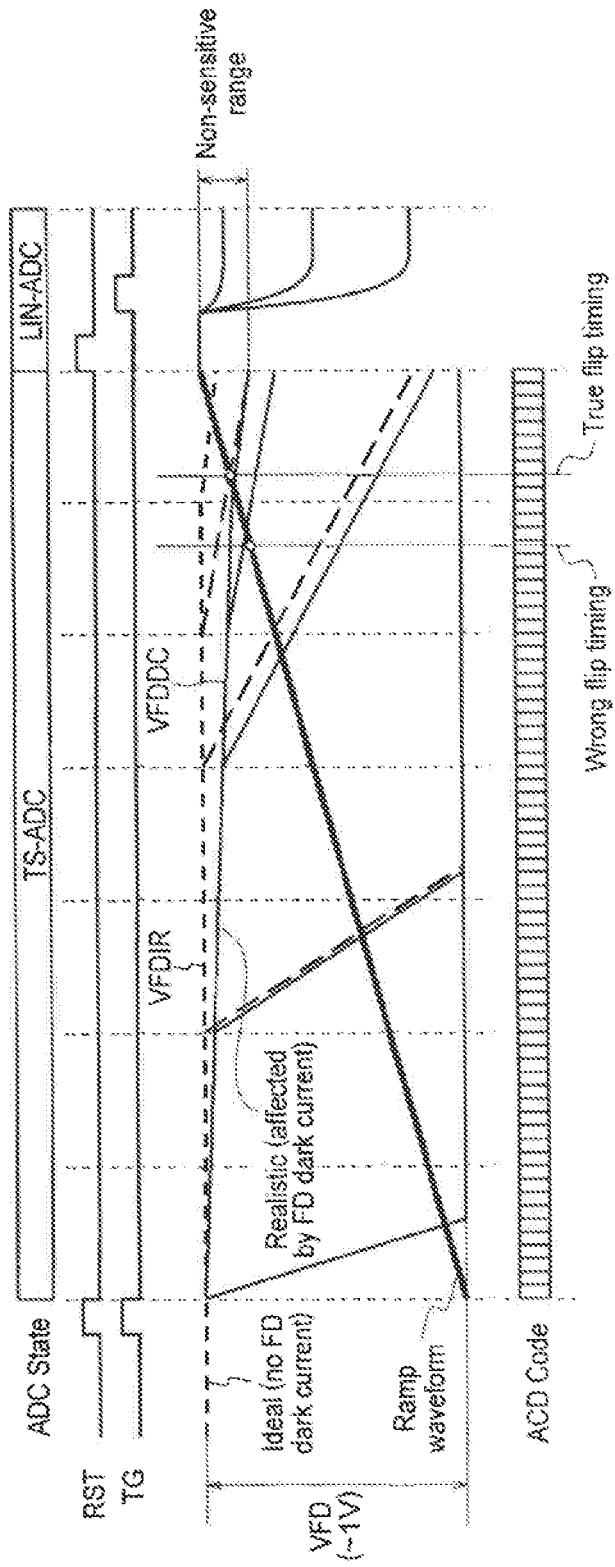
FIG. 11 is a view for explaining an influence of a dark current of a floating diffusion exerted upon the basic first comparison processing at the time of time stamp ADC mode.

FIG. 11 is a view for explaining the influence of the dark current of the floating diffusion FD1 exerted upon the basic first comparison processing explained before at the time of the time stamp ADC mode.

As shown in FIG. 11, in an ideal situation where a dark current of the floating diffusion FD1 is not generated, the FD voltage VFDIR is maintained at the same level, and only the overflow charge causes a voltage drop. In actuality, however, a dark current of the floating diffusion FD1 is generated and the FD voltage VFDDC falls in response to that. The dark current of the floating diffusion FD1 is proportional to the first comparison processing period PCMPR1 in which the period is the time stamp ADC (TS-ADC) period which is 10 ms at the maximum. Accordingly, the change of the inversion (flip) time of the comparator 221 is largely influenced by the dark current and shot noise of the floating diffusion FD1, therefore an offset of images in the entire column, that is, non-linearity in the fixed pattern noise (FPN), and in the AC conversion transfer curve is liable to occur. Further, it is difficult to separate the charge of the dark current of the floating diffusion FD1 from an actual overflow charge, therefore a joining gap (AD conversion code gap) arises at the joining points of the first AC conversion transfer curve TC1 and the second AD conversion transfer curve TC2 to be joined (boundary of AD conversion codes), so sometimes the linearity is not always guaranteed in the switching region thereof. In such a case, smooth switching becomes impossible, the discontinuous points thereof become noise, and this becomes a cause of so-called tone jump or other deterioration of the image. Accordingly, it is important to suppress the influence of the dark current of the floating diffusion FD1.

Figure 12:
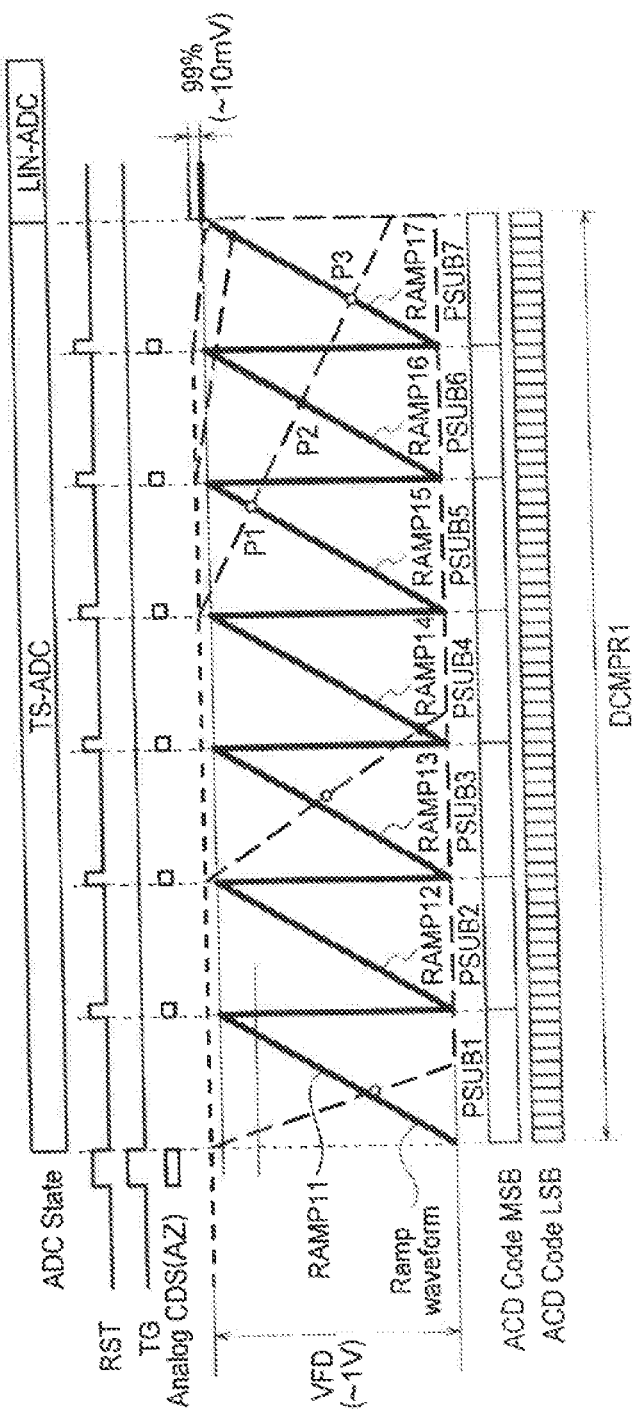
FIG. 12 is a view for explaining an AD conversion processing method etc. in a first comparison processing period for suppressing or cancelling the influence of the dark current of the floating diffusion.
Figure 13:
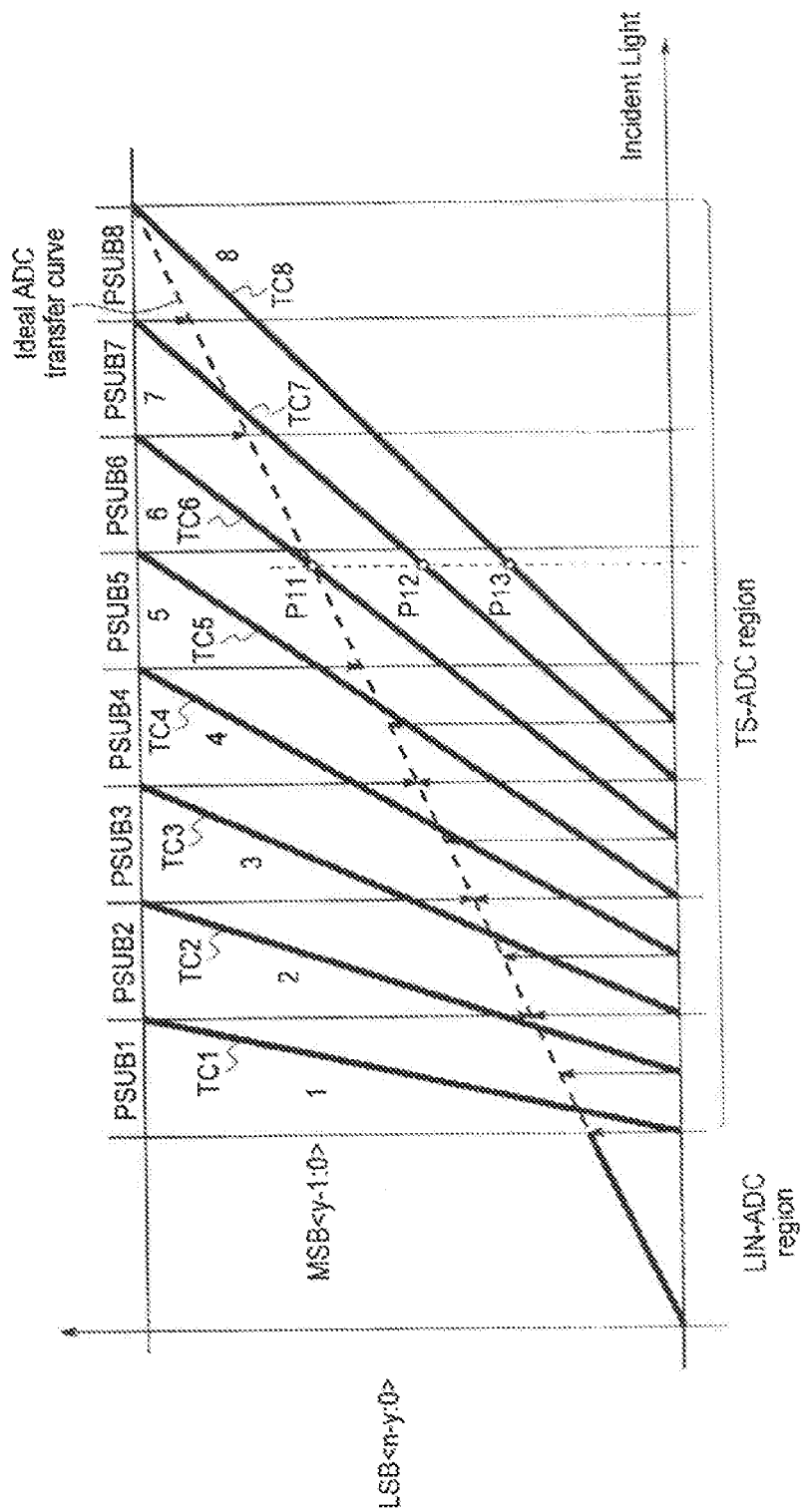
FIG. 13 is a view for explaining an AD conversion transfer curve etc. according to the AD conversion processing method in the first comparison processing period in FIG. 12.

FIG. 12 is a view for explaining the AD conversion processing method in the first comparison processing period for suppressing or cancelling the influence of the dark current of the floating diffusion FD1. FIG. 13 is a view for explaining the AD conversion transfer curve etc. according to the AD conversion processing method in the first comparison processing period in FIG. 12.

In the time stamp ADC of the first comparison processing in the present example, in order to suppress or cancel the influence of the dark current of the floating diffusion FD1 forming the output node ND1, the period PCMPR1 of the first comparison processing is divided into a plurality of (seven as an example in FIG. 12) sub periods PSUB1 to PSUB7. In each of the sub periods PSUB1 to PSUB7, AD conversion processing comparing the voltage signal VSL of the output buffer part 211 and the reference voltage VREF1 and outputting the digitized comparison result signal is carried out. That is, the reading part 60, in each of the plurality of sub periods PSUB1 to PSUB7, resets at least the floating diffusion FD1 forming the output node to the reset level, then performs the AD conversion processing comparing the voltage signal VSL of the output buffer part 211 and the reference voltage VREF1. More specifically, the reading part 60, in each of the plurality of sub periods PSUB1 to PSUB7, repeatedly executes the AD conversion processing comparing the voltage signal VSL (VFD) of the output buffer part 211 and the ramp state sub reference voltages RAMP11 to RAMP17 from resetting of at least the floating diffusion FD1 forming the output node to the reset level up to the end of the sub periods PSUB1 to PSUB7.

In other words, the AD conversion processing in this time stamp ADC aims at cancellation or suppression of the influence of the dark current of the floating diffusion FD1 by convolution (folding or returning) of the ramp waveform of the AD conversion and prepares a lengthy AD conversion transfer curve.

In the AD conversion processing method in the time stamp ADC, the exposure tome (integration period) is divided by a plurality of ADC conversion time slots, the floating diffusion FD1 is cleared first and the analog CDS is carried out, and then the AD conversion processing comparing the voltage signal VSL of the output buffer part 211 and the ramp state sub reference voltage RAMP11 to RAMP17 is repeatedly executed. In this way, by periodically clearing the floating diffusion FD1, it becomes possible to ignore the dark current of the floating diffusion FD1 even at a higher operation temperature.

For example, in a case where the dark current of the floating diffusion FD1 is 100 el/sec at 10 ms, by performing sub AD conversion operation 16 times, only 6.25 el of dark current is generated by periodical AD conversion of 1.25 ms. This is much smaller than a photon shot noise. This is usually up to 70 el in a case of full well capacity of 5 kel. Accordingly, the influence of the dark current of the floating diffusion FD1 is masked by the photon shot noise.

The ADC_CODE <n-1:0> is segmented into an MSB bit and LSB bit. Here, the MSB bit represents the number of AD conversion cycle when the comparator 221 inverts. Further, the LSB bit represents a fine code step in each AD conversion cycle. In this way, the inversion (flip) timing of the comparator 221 can be recorded without generating a missing code.

According to the above scheme, it becomes possible to prepare overflow regions of the AD conversion transfer curves TC. According to this overlapping, even if fine AD conversion is carried out in the sub periods, the time stamp (TS) AD conversion codes be regenerated without generating a code jump at the joints. Further, it is possible to stop a source follower bias current of the digital pixel 200 and a bias current of the comparator 221 to reduce the power consumption. Further, the analog CDS operation can be carried out for each AD conversion, therefore 1/f noise and RST noise including offset can be greatly suppressed, so it is possible to reduce the reading of noise of the time stamp (TS) ADC.

As explained above, a plurality of sub AD conversions are carried out in the first comparison processing period of the time stamp (TS) ADC mode. However, the final values of the ramp state sub reference voltages RAMP11 to RAMP17 set in the sub periods PSUB1 to PSUB7 are for example set to 99% as shown in FIG. 12. These final values of the sub reference voltages RAMP11 to RAMP17 can be set to any values. However, in at least the last sub period PSUB7, the final values of the sub reference voltages RAMP11 to RAMP17 are desirably set to levels capable of avoiding erroneous judgment in the comparator 221 even if the output voltage signal of the output buffer part 211 changes due to the dark current of the floating diffusion FD1. The percentage of the final value differs according to actual circuit conditions.

Further, in the example in FIG. 12, the ADC_CODE is classified into MSB and LSB segments. Here, when the next sub AD conversion is started, the MSB code increases/decreases. The LSB code increases/decreases at the time of the sub AD conversion and is reset to the initial value at the time of start of the sub AD conversion.

As shown in FIG. 12, for the so-called folding characteristic of the ramp waveform, there are a plurality of inversion (flip) points (for example P1, P2, and P3) of the comparator 221. Note, the ADC_CODE of the first inversion point is stored in the SRAM of the ASIC pixel and is safely held by a memory overwrite protection function built in the ASIC pixel. Note that, the inversion points P1, P2, and P3 represent the same final AD conversion code.

Further, in the present embodiment, as shown in FIG. 13, the AD conversion transfer functions STC1 to STC8 in the sub periods PSUB1 to PSUB7 (in the example in FIG. 13, the number of sub periods is determined as eight as an example) are linearized by applying inversion transfer functions. The AD conversion transfer curves obtained in the plurality of sub periods PSUB1 to PSUB7 include overlapping regions in at least two sub periods. In this way, the AD conversion transfer functions overlap a little, therefore one incident light includes a plurality of AD conversion codes. They become like the points P11, P12, and P13 in FIG. 13. In FIG. 13, MSB<y-1:0> represents the number of times of transfer of the sub AD conversion, and LSB <n-y:0> represents the range of an equivalent FD voltage.

As described above, in the AD conversion processing method in the first comparison processing period for suppressing or cancelling the influence of the dark current of the floating diffusion FD1, the exposure time (integration period) is divided by a plurality of ADC conversion time slots, the floating diffusion FD1 is cleared first to perform the analog CDS, and then the AD conversion processing comparing the voltage signal VSL of the output buffer part 211 and the ramp state sub reference voltages RAMP11 to RAMP17 is repeatedly executed. Due to this, it becomes possible to exclude the influence of the dark current of the floating diffusion FD1 and reduce the AD conversion code gap at the boundary of the time stamp ADC (TS-ADC) and the linear ADC (LIN-ADC). Further, low frequency noise such as 1/f or RTS is short in the AD conversion cycle, so is greatly removed by the analog CDS operation.

Further, the final values of the ramp state sub reference voltages RAMP11 to RAMP17 set in the sub periods PSUB1 to PSUB7 are for example set to 99%. Due to this, at the time of each sub AD conversion, it becomes possible to prevent occurrence of erroneous inversion (flip) of the comparator 221 due to clock field through and mismatch of the comparator 221.

Further, the AD conversion transfer curves obtained in the plurality of sub periods PSUB1 to PSUB7 can include overlapping regions in at least two sub periods, therefore it becomes possible to prevent loss of the AD conversion code.

Stacked Structure of Solid-State Imaging Device 10

Next, the stacked structure of the solid-state imaging device 10 according to the first embodiment will be explained.

Figure 15:
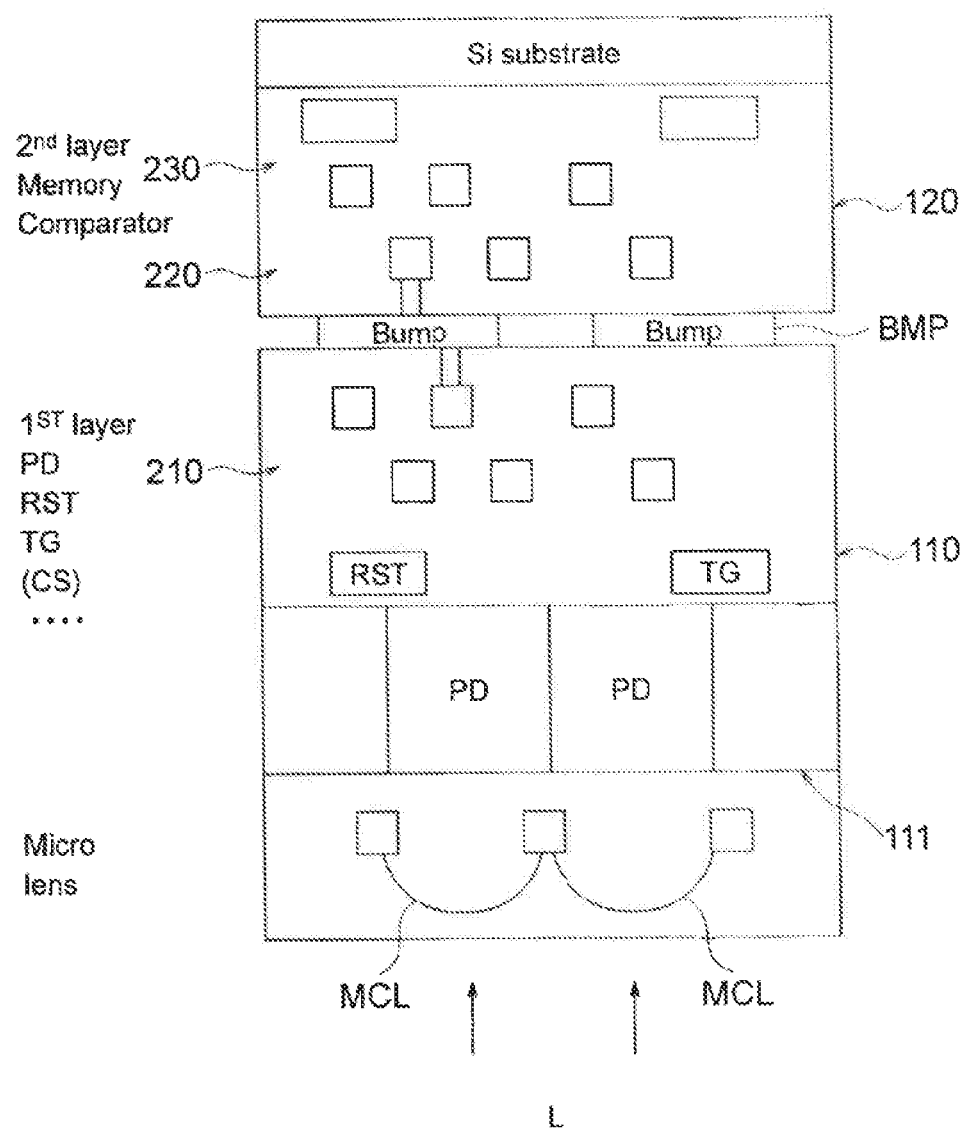
FIG. 15 is a schematic cross-sectional view for explaining the stacked structure of the solid-state imaging device according to the first embodiment.

FIG. 14A and FIG. 14B are schematic views for explaining the stacked structure of the solid-state imaging device 10 according to the first embodiment. FIG. 15 is a simplified view for explaining the stacked structure of the solid-state imaging device 10 according to the first embodiment.

The solid-state imaging device 10 according to the first embodiment has a stacked structure of a first substrate (upper substrate) 110 and a second substrate (lower substrate) 120. The solid-state imaging device 10 is for example formed as an image capturing device having a stacked structure obtained by bonding the substrates to each other at a wafer level and cutting them by dicing. In the present example, the device has a structure of the first substrate 110 and the second substrate 120 which are stacked.

On the first substrate 110, the photoelectric converting and reading parts 210 of the digital pixels 200 in the pixel part 20 are formed centered about its center part. The photodiodes PD1 are formed on the first surface 111 side of the first substrate 110 which is the side where the light L is incident, and micro lenses MCL and color filter are formed on the light incident side. On the second surface side of the first substrate 110, the transfer transistor TG1-Tr, the reset transistor RST1-Tr, the source follower transistor SF1-Tr, and the current transistor IC1-Tr are formed.

In this way, in the first embodiment, basically the photoelectric converting and reading parts 210 of the digital pixels 200 are formed in a matrix on the first substrate 110.

On the second substrate 120, AD conversion parts 220 and memory parts 230 of the digital pixels 200 are formed in a matrix. Further, the vertical scanning circuit 30, the output circuit 40, and the timing control circuit 50 may be formed on the second substrate 120 as well.

In such a stacked structure, the read-out nodes ND2 of the photoelectric converting and reading parts 210 on the first substrate 110 and the inverted input terminals (−) of the comparators 221 in the digital pixels 200 on the second substrate 120 are individually electrically connected using the signal line LSGN1, micro bumps BMP, vias (die-to-die vias), and the like as shown in for example FIG. 3. Further, in the present embodiment, the read-out nodes ND2 of the photoelectric converting and reading parts 210 on the first substrate 110 and the inverted input terminals (−) of the comparators 221 in the digital pixels 200 on the second substrate 120 are AC-coupled by coupling capacitors C221.

Reading Operation of Solid-State Imaging Device 10

The characteristic configurations and functions of the parts in the solid-state imaging device 10 were explained above. Next, the reading operation etc. of the pixel signals of the digital pixels 200 in the solid-state imaging device 10 according to the first embodiment will be explained.

Figure 16:
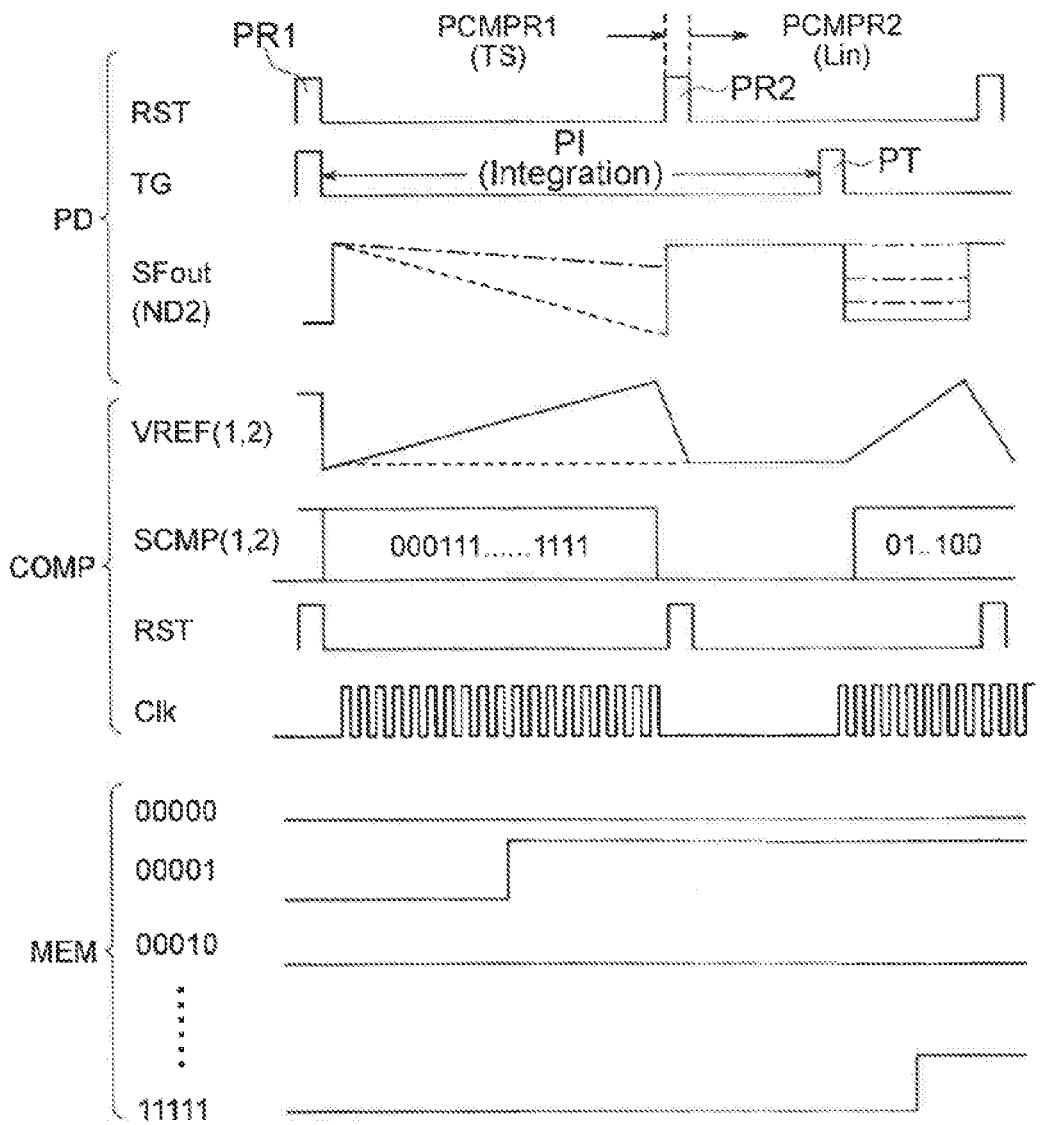
FIG. 16 is a tuning chart for mainly explaining the reading operation in the pixel part at the time of a predetermined shutter mode in the solid-state imaging device according to the first embodiment.

FIG. 16 is a timing chart for mainly explaining the reading operation in the pixel part at the time of a predetermined shutter mode of the solid-state imaging device according to the first embodiment. FIG. 17A to FIG. 17D are views showing operation sequences and potential transitions for mainly explaining the reading operation in the pixel part at the time of a predetermined shutter mode in the solid-state imaging device according to the first embodiment.

Figure 17:
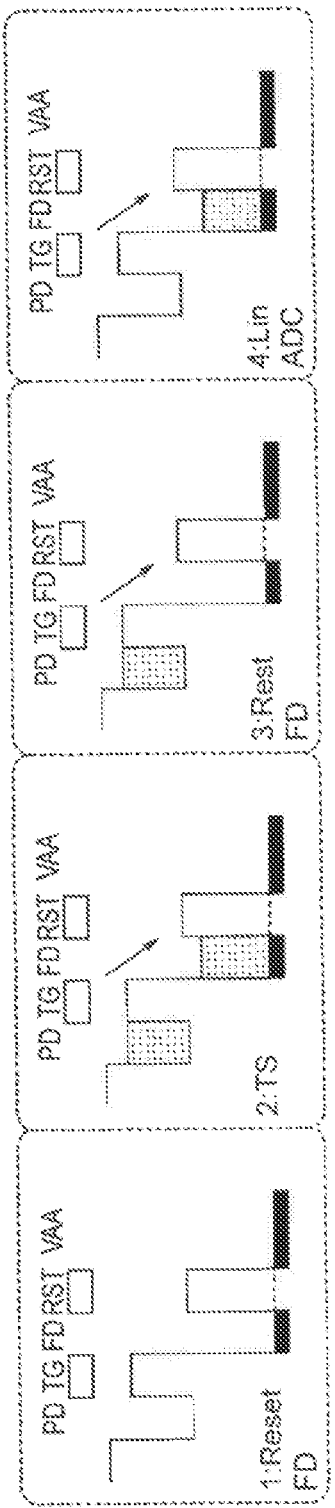
FIG. 17A to FIG. 17D are views showing the operation sequences and potential transitions for mainly explaining the reading operation in the pixel part at the time of the predetermined shutter mode in the solid-state imaging device according to the first embodiment.

First, at the start of the reading operation, as shown in FIG. 16 and FIG. 17A, a global reset resetting the photodiodes PD1 and floating diffusions FD1 in the digital pixels 200 is carried out. In the global reset, the reset transistor RST1-Tr and transfer transistor TG1-Tr are held in a conductive state for a predetermined period simultaneously for all pixels and the photodiodes PD1 and floating diffusions FD1 are reset. Further, the reset transistor RST1-Tr and transfer transistor TG1-Tr are switched to a non-conductive state simultaneously for all pixels, and exposure, that is accumulation of charge, is started simultaneously and in parallel for all pixels.

Further, as shown in FIG. 15 and FIG. 17B, the operation of time stamp (TS) ADC mode with respect to the overflow charge is started. The overflow charges are accumulated in the floating diffusions FD1 in the integration period PI. The time stamp ADC mode operates in the integration time PI, specifically in a period in the integration period PI up to reset of the floating diffusions FD1.

In the time stamp (TS) ADC mode, in the photoelectrically converting and reading part 210, corresponding to the first comparison processing period PCMPR1 of the AD conversion part 220, a voltage signal VSL1 corresponding to the overflow charge overflowing from the photodiode PD1 to the floating diffusion FD1 as the output node in the integration period PI is output. Further, in the comparator 221 of the AD conversion part 220, the first comparison processing CMPR1 is carried out. In the tune stamp ADC of the first comparison processing, in order to suppress or cancel the influence of the dark current of the floating diffusion FD1 forming the output node ND1, the period PCMPR1 of the first comparison processing is for example divided into the plurality of sub periods PSUB1 to PSUB7 and, in each of the sub periods PSUB1 to PSUB7, AD conversion processing comparing the voltage signal VSL of the output buffer part 211 and the reference voltage VREF1 and outputting the digitized first comparison result signal SCMP1 is carried out. More specifically, in each of the plurality of sub periods PSUB1 to PSUB7, ad conversion processing comparing the voltage signal VSL of the output buffer part 211 and the ramp state sub reference voltages RAMP11 to RAMP17 is repeatedly executed from resetting of at least the floating diffusion PD1 forming the output node to the reset level up to the end of the sub periods PSUB1 to PSUB7. Each first comparison result signal SCMP1 is output from the comparator 221 and the digital data corresponding to the first comparison result signal SCMP1 is stored in the memory 231 in the memory part 230.

Next, as shown in FIG. 16 and FIG. 17C, the operation of the time stamp (TS) ADC mode with respect to the overflow charge ends and the mode transits to the linear ADC mode and the operation shifts to the reset period PR2 of the floating diffusion FD1. In the reset period PR2, the reset transistor RST1-Tr is held in a conductive state for a predetermined period and the floating diffusion FD1 is reset. The signal at the time of reset of the floating diffusion FD1

(VRST) is read out and the digital signal is stored in the memory 232 of the memory part 230. Further, the reset transistor RST1-Tr is switched to a non-conductive state. In this case, the integration period PI is continued.

Next, as shown in FIG. 16 and FIG. 17D, the integration period PI ends and the operation shifts to the transfer period PT. In the transfer period PT, the transfer transistor TG1-Tr is held in a conductive state for a predetermined period and the accumulated charge in the photodiode PD1 is transferred to the floating diffusion FD1.

In the linear (LIN) ADC mode, in the photoelectrically converting and reading part 210, corresponding to the second comparison processing period PCMPR2 of the AD conversion part 220, after the end of the integration period PI, a voltage signal VSL2 corresponding to the accumulated charge transferred from the photodiode PD1 to the floating diffusion FD1 as the output node is output. Further, in the comparator 221 of the AD conversion part 220, the second comparison processing CMPR2 is carried out. In the comparator 221, under the control of the reading part 60, after the integration period PI, a digitized second comparison result signal SCMP2 with respect to the voltage signal VSL2 corresponding to the accumulated charge transferred from the photodiode PD1 to the floating diffusion FD1 as the output node is output and the digital data corresponding to the second comparison result signal SCMP2 is stored in the memory 232 of the memory part 230.

The signal read out to the memory part 230 is executed by reading the digital signal data from the memory node. It has an MIPI data format and is, for example, sent to the outside of the solid-state imaging device 10 (image sensor) through the IO buffer 41 of the output circuit 40. This operation is globally executed with respect to the entire pixel array.

As explained above, according to the first embodiment, the solid-state imaging device 10 is configured as for example a stacked type CMOS image sensor including, in the pixel part 20, the digital pixels of the photoelectric converting and reading parts 210, the AD conversion parts 220, and the memory parts 230 and having a global shutter operation function. In the solid-state imaging device 10 according to the first embodiment, each digital pixel 200 has the AD conversion function, and the AD conversion part 220 has the comparator 221 performing comparison processing comparing the voltage signal read out by the photoelectric converting and reading part 210 and the reference voltage and outputting the digitized comparison result signal. Further, under the control of the reading part 60, the comparator 221 performs the first comparison processing outputting the digitized first comparison result signal SCMP1 with respect to the voltage signal corresponding to the overflow charge overflowing from the photodiode PD1 to the output node (floating diffusion) FD1 in the integration period and the second comparison processing CMPR2 outputting the digitized second comparison result signal SCMP2 with respect to the voltage signal corresponding to the accumulated charge of the photodiode PD1 transferred to the floating diffusion FD1 (output node) in the transfer period after the integration period.

Further, in the time stamp ADC of the first comparison processing, in order to suppress or cancel the influence of the dark current of the floating diffusion FD1 forming the output node ND1, the period PCMPR1 of the first comparison processing is divided into the plurality of (seven as an example in the present example) sub periods PSUB1 to PSUB7 and, in each of the sub periods PSUB1 to PSUB7, the AD conversion processing comparing the voltage signal VSL of the output buffer part 211 and the reference voltage VREF1 and outputting the digitized comparison result signal is carried out.

Accordingly, according to the solid-state imaging device 10 in the first embodiment, the charges overflowing from the photodiodes in the integration period are utilized in real time, so it becomes possible to suppress or cancel the influence of the dark current of the floating diffusion FD1, therefore it becomes possible to suppress deterioration of the image while substantially realizing a broader dynamic range and a higher frame rate. Further, according to the first invention, it is possible to substantially realize a broader dynamic range and a higher frame rate and in addition possible to lower noise, possible to expand the effective pixel region to the maximum limit, and possible to raise the value relative to the cost to the maximum limit.

Further, according to the first embodiment, after dividing the exposure time (integration period) by a plurality of ADC conversion time slots, clearing the floating diffusion FD1 first and performing the analog CDS, the AD conversion processing comparing the voltage signal VSL of the output buffer part 211 and the ramp state sub reference voltages RAMP11 to RAMP17 is repeatedly executed. Due to this, it becomes possible to exclude the influence of the dark current of the floating diffusion FD1 and possible to reduce the AD conversion code gap at the boundary of the time stamp ADC (TS-ADC) and the linear ADC (LIN-ADC). Further, low frequency noise such as 1/f or RTS is short in the AD conversion cycle, so can be greatly removed by the analog CDS operation.

Further, the final values of the ramp state sub reference voltages RAMP11 to RAMP17 set in the sub periods PSUB1 to PSUB7 are for example set to 99%. Due to this, at the time of each sub AD conversion, it becomes possible to prevent occurrence of erroneous inversion (flip) of the comparator 221 due to clock field through and mismatch of the comparator 221.

Further, the AD conversion transfer curves obtained in the plurality of sub periods PSUB1 to PSUB7 can include overlapping regions in at least two sub periods, therefore it becomes possible to prevent loss of the AD conversion code. In other words, according to this overlapping, even if fine AD conversion is carried out in the sub periods, the time stamp (TS) AD conversion codes can be regenerated without causing a code jump at the joints.

Further, according to the solid-state imaging device 10 of the first embodiment, it is possible to prevent complication of the configuration while preventing a drop in the area efficiency in layout.

Further, the solid-state imaging device 10 according to the first embodiment has a stacked structure of the first substrate (upper substrate) 110 and second substrate (lower substrate) 120. Accordingly, in the first embodiment, basically, by forming the first substrate 110 side by only the NMOS system elements and by expanding the effective pixel region to the maximum limit by the pixel array, the value relative to the cost can be raised to the maximum limit.

Second Embodiment

Figure 18:
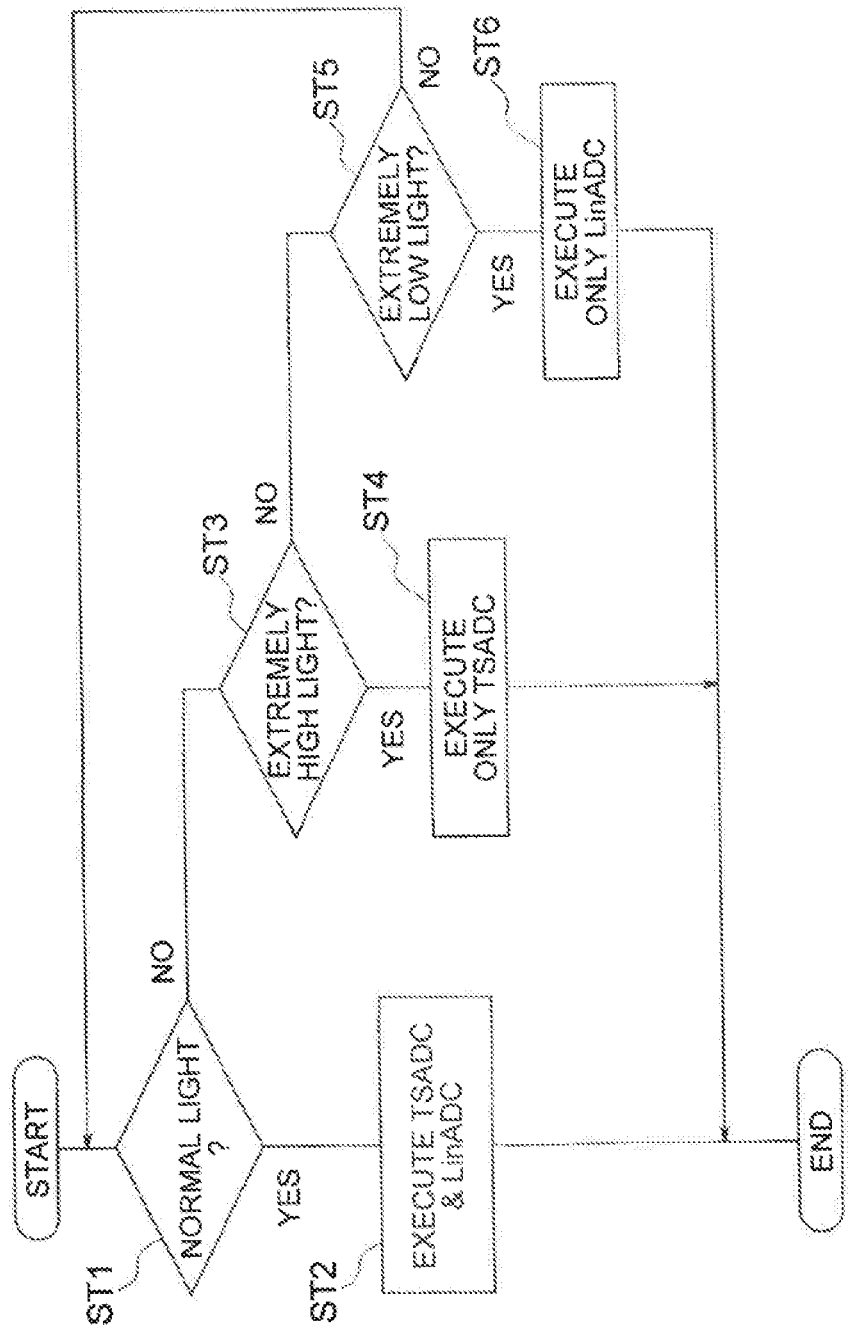
FIG. 18 is a view for explaining a solid-state imaging device according to a second embodiment of the present invention and a view showing an example of selection processing of a time stamp ADC mode operation and linear ADC mode operation.

FIG. 18 is a view for explaining a solid-state imaging device according to a second embodiment of the present invention and is a view showing an example of selection processing of a time stamp ADC mode operation and linear ADC mode operation.

The difference of a solid-state imaging device 10A according to the second embodiment from the solid-state imaging device 10 according to the first embodiment explained above is as follows. In the solid-state imaging device 10 according to the first embodiment, the time stamp (TS) ADC mode operation and the linear (Lin) ADC mode operation are successively carried out.

Contrary to this, in the solid-state imaging device 10A according to the second embodiment, the time stamp (TS) ADC node operation and the linear (Lin) ADC mode operation can be selectively carried out corresponding to the light.

In the example in FIG. 18, in a case of normal light (ST1), the time stamp ADC mode operation and the linear ADC mode operation are continuously carried out (ST2). In a case where the light is not normal but is very (extremely) high (ST1, ST3), a probability of overflowing of the charge from the photodiode PD1 to the floating diffusion FD1 is high, therefore only the time stamp ADC mode operation is carried out (ST4). In a case where the light is not normal, not very (extremely) high either, but very (extremely) low (ST1, ST3, ST15), the probability of overflowing of the charge from the photodiode FD1 to the floating diffusion FD1 is extremely low, therefore only the linear ADC mode operation is carried out (ST6).

According to the second embodiment, the same effect as the effect by the first embodiment explained above can be obtained of course. Also, it becomes possible to raise the speed of read-out processing and lower the power consumption.

Third Embodiment

Figure 19:
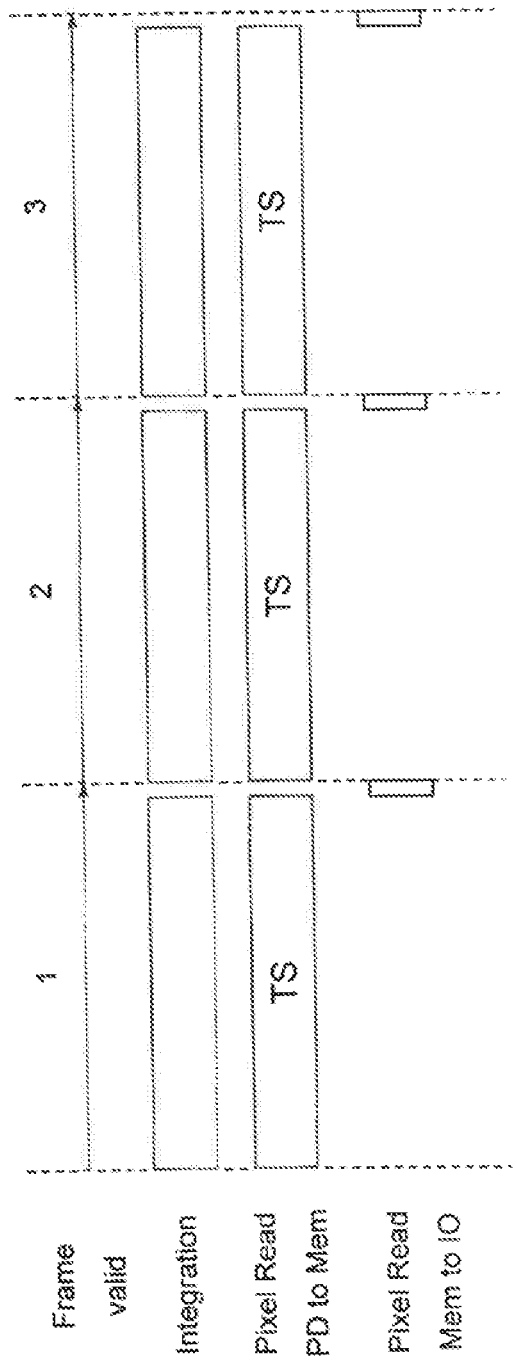
FIG. 19 is a view showing an example of a frame read out sequence in a solid-state imaging device according to a third embodiment of the present invention.
Figure 20:
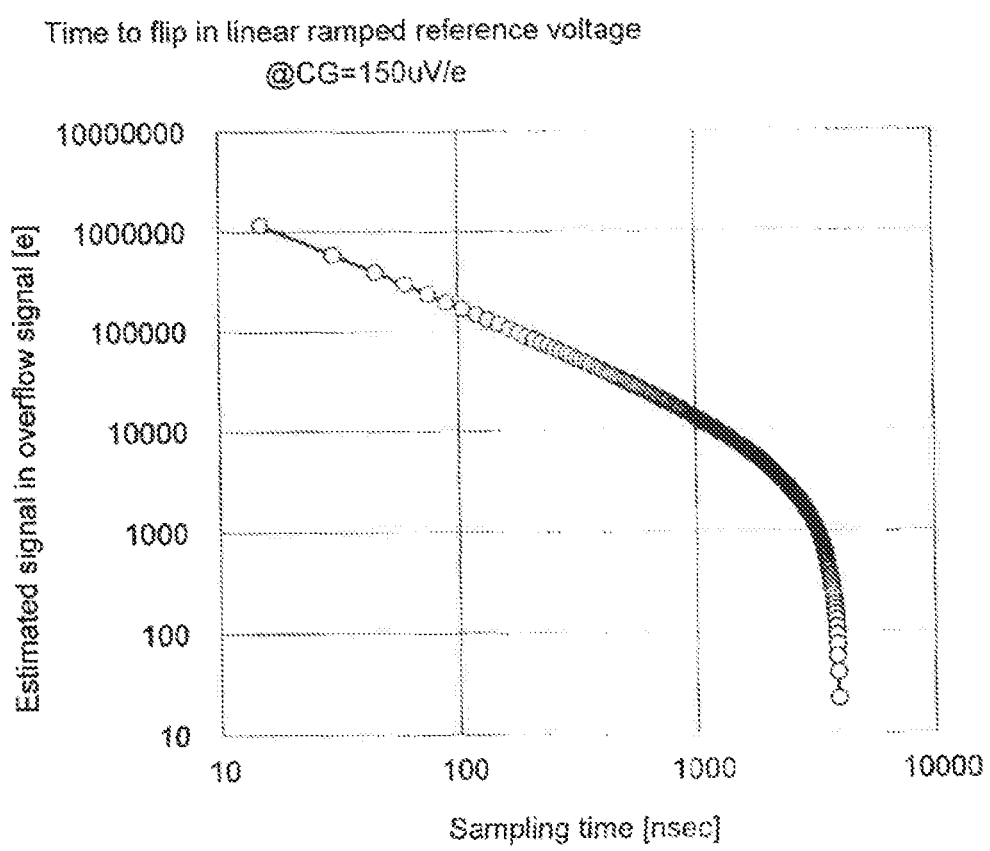
FIG. 20 is a view showing a state of light-to-time conversion where a reference voltage is input to a comparator according to the third embodiment.
Figure 21A:
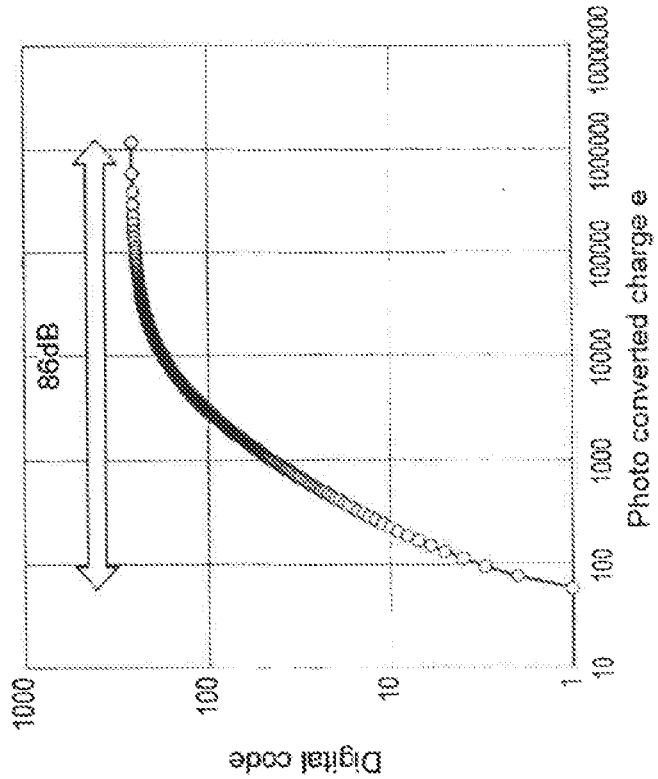
FIG. 21A and FIG. 21B are views showing relationships between a digital code and the quantities of charge according to a light conversion in the third embodiment.
Figure 21B:
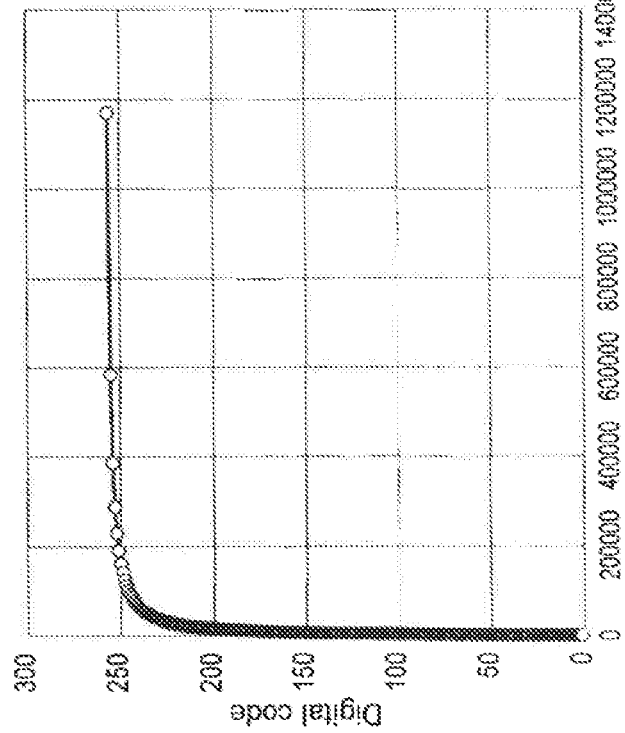

FIG. 19 is a view showing an example of a frame read out sequence in a solid-state imaging device 10B according to a third embodiment of the present invention. FIG. 20 is a view showing a state of light-to-time conversion where the reference voltage is input to a comparator according to the third embodiment. In FIG. 20, an abscissa indicates a sampling time, and an ordinate indicates the estimated signal in the overflow signal. Note that, the overflow signal referred to here is estimated by rendering the transfer transistor TG1-Tr the conductive state to set a condition where the charge is not accumulated in the photodiodes PD1 (non-overflow). FIG. 20 shows a sampling time at which the comparator 221 inverts which corresponds to the non-overflow charge (signal) according to the nature (suitability) of the light applied. FIG. 21A and FIG. 21B are views showing the relationships between the digital codes and the quantities of charge according to the light conversion in the third embodiment. FIG. 21A shows the characteristic where use is made of the linear ramp signal, and FIG. 21B shows the characteristic where use is made of a log signal.

In the third embodiment, the reading part 60 controls the comparator 221 so as to output the digitized first comparison result signal SCMP1 with respect to the voltage signal VSL corresponding to the charge by the first comparison processing CMPR1 even if a charge does not overflow from the photodiode PD1 to the floating diffusion FD1 as the output node in the integration period.

In the third embodiment, good conversion processing can be realized and, depending on the case, a dynamic range performance of 86 dB can be realized.

Fourth Embodiment

Figure 22:
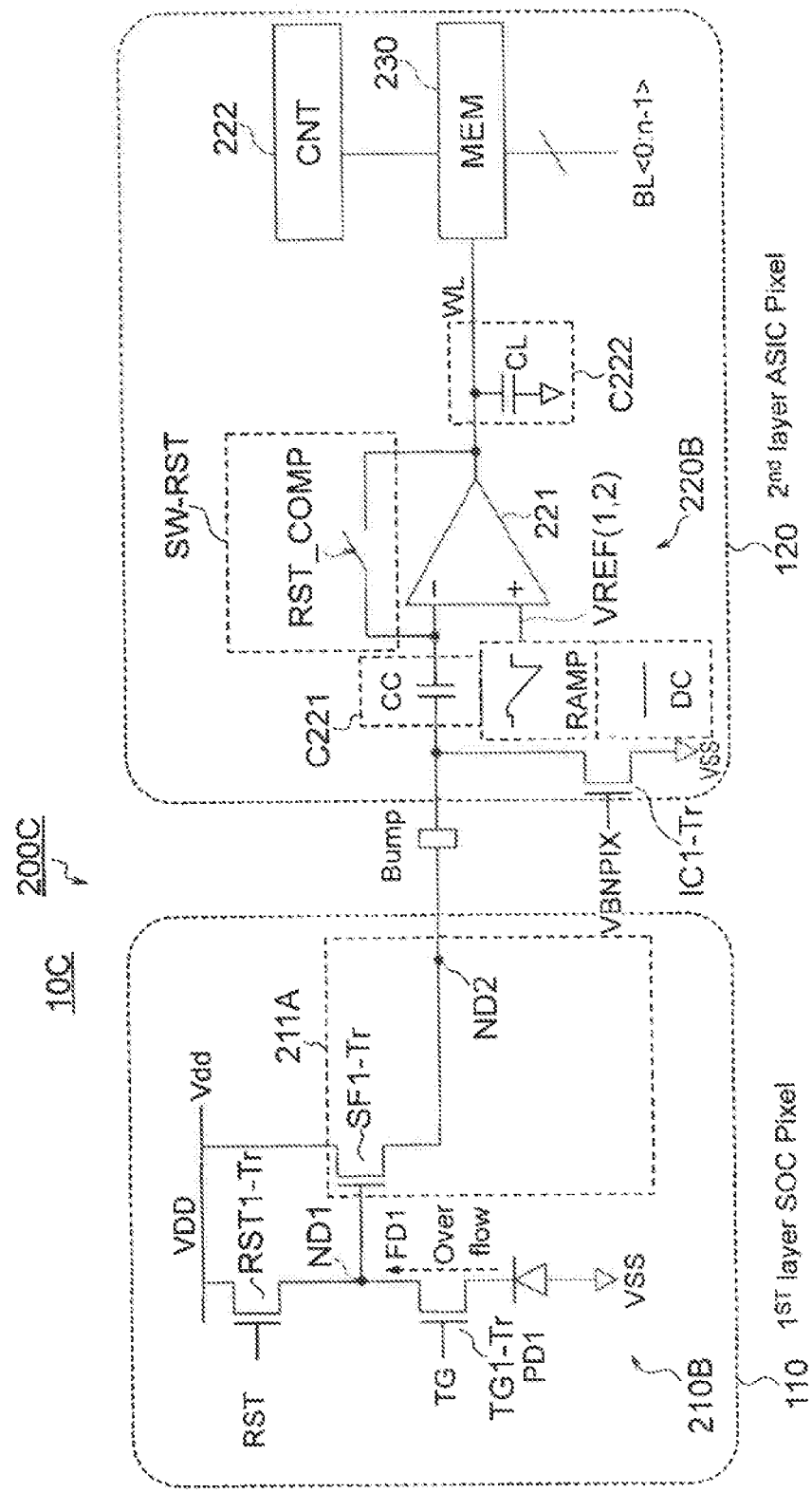
FIG. 22 is a circuit diagram showing an example of a pixel in a solid-state imaging device according to a fourth embodiment of the present invention.

FIG. 22 is a view showing an example of the configuration of a solid-state imaging device according to a fourth embodiment of the present invention.

The difference of a solid-state imaging device 10C according to the fourth embodiment from the solid-state imaging device 10 according to the first embodiment explained above is as follows. In the solid-state imaging device 10C according to the fourth embodiment, the current transistor IC1-Tr as the current source is arranged not on the first substrate 110 side, but on for example the input side of the AD conversion part 220 on the second substrate 120 side.

According to the fourth embodiment, the same effect as the effect by the first embodiment explained above can be obtained.

The solid-state imaging devices 10, 10A, 10B, and 10C explained above can be applied, as image capturing devices, to digital cameras, video cameras, portable terminals, or monitoring cameras, cameras for medical endoscopes, and other electronic apparatuses.

Figure 23:
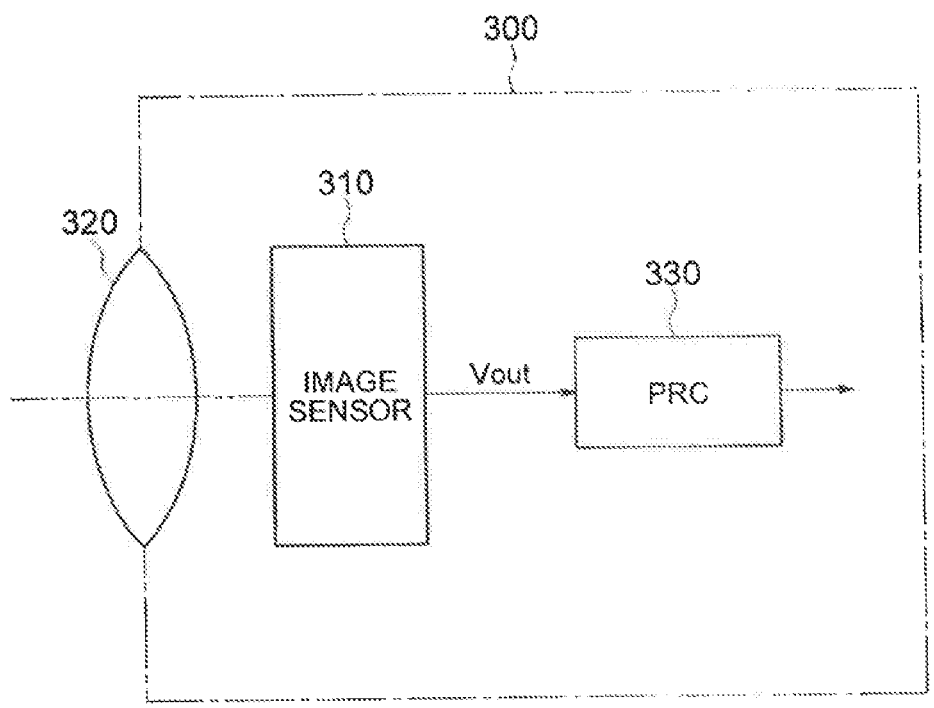
FIG. 23 is a view showing an example of the configuration of an electronic apparatus to which the solid-state imaging device according to an embodiment of the present invention is applied.

FIG. 23 is a view showing an example of the configuration of an electronic apparatus mounting a camera system to which the solid-state imaging device according to an embodiment of the present invention is applied.

The electronic apparatus 300, as shown in FIG. 23, has a CMOS image sensor 310 to which the solid-state imaging device 10 according to the present embodiment can be allied. Further, the electronic apparatus 300 has an optical system (lens etc.) 320 which guides an incident light (forms a subject image) into a pixel region of this CMOS image sensor 310. The electronic apparatus 300 has a signal processing circuit (PRC) 330 for processing the output signals of the CMOS image sensor 310.

The signal processing circuit 330 applies predetermined signal processing with respect to the output signals of the CMOS image sensor 310. The image signal processed in the signal processing circuit 330 can be projected as a moving image onto a monitor formed by a liquid crystal display or the like or can be output to a printer. Further, it can be directly recorded in a recording medium such as a memory card. Various embodiments are possible.

As explained above, by mounting the solid-state imaging devices 10, 10A, 10B, and 10C explained before as the CMOS image sensors 310, it becomes possible to provide high performance, small-sized, and low-cost camera systems. Further, it is possible to realize for example monitoring cameras or cameras for medical endoscopes or other electronic apparatuses which are used for applications where there are restrictions in mounting size, number of connectable cables, cable length, installation height, etc. in requirements for camera installation.

What is claimed is:
1. A solid-state imaging device, comprising:
a pixel part in which pixels for performing photoelectric conversion are arranged and
a reading part which reads out pixel signals from the pixels in the pixel part, wherein
each pixel includes
a photoelectric conversion element which accumulates a charge generated by photoelectric conversion in an integration period,
a transfer element capable of transferring the charge accumulated in the photoelectric conversion element in a transfer period after the integration period,
an output node formed by a floating diffusion to which the charge accumulated in the photoelectric conversion element is transferred through the transfer element,
an output buffer part which converts the charge at the output node to a voltage signal corresponding to a quantity of the charge and outputs the converted voltage signal, and a comparator which performs comparison processing for comparing the voltage signal of the output buffer part and a reference voltage and outputting a digitized comparison result signal, and a memory part for storing data corresponding to the digitized comparison result signal of the comparator, the comparator, under control of the reading part, performs a first comparison processing for outputting a digitized first comparison result signal with respect to the voltage signal corresponding to an overflow charge overflowing from the photoelectric conversion element to the output node in the integration period, and a second comparison processing for outputting a digitized second comparison result signal with respect to the voltage signal corresponding to the accumulated charge of the photoelectric conversion element transferred to the output node in the transfer period after the integration period, and in the first comparison processing, a period of the first comparison processing is divided into a plurality of sub periods, and in each of the sub periods, the comparator performs analog-to-digital (AD) conversion processing for comparing the voltage signal of the output buffer part and the reference voltage and outputting the digitized comparison result signal.

2. The solid-state imaging device according to claim 1, wherein:
the reading part, in each of the plurality of sub periods, resets at least the output node to a reset level, and then performs AD conversion processing for comparing the voltage signal of the output buffer part and the reference voltage.

3. The solid-state imaging device according to claim 1, wherein:
the reading part, in each of the plurality of sub periods, repeatedly executes AD conversion processing for comparing the voltage signal of the output buffer part and a ramp shaped sub reference voltage from resetting of at least the output node to a reset level up to an end of each of the sub periods.

4. The solid-state imaging device according to claim 3, wherein:
final values of the ramp shaped sub reference voltage, in at least the last sub period, are set to levels capable of avoiding erroneous judgment in the comparator even if the output voltage signal of the output buffer part changes due to a dark current of the output node.

5. The solid-state imaging device according to claim 1, wherein:
AD conversion transfer curves obtained in the plurality of sub periods include overlapping regions in at least two sub periods.

6. The solid-state imaging device according to claim 1, wherein:
an AD conversion transfer function in each of the sub periods is linearized by applying an inversion transfer function.

7. The solid-state imaging device according to claim 1, wherein:
an AD conversion code is segmented into an MSB bit and an LSB bit, the MSB bit represents a number of AD conversion cycles when an output of the comparator inverts, and the LSB bit represents a code step in each AD conversion cycle.

8. The solid-state imaging device according to claim 7, wherein:
the MSB code increases/decreases at a time when the AD conversion processing in the next sub period is started, and the LSB code increases/decreases at a time of the AD conversion processing of each sub period and is reset to an initial value at a time of start of the AD conversion of the sub period.

9. The solid-state imaging device according to claim 1, wherein:
the comparator, in the first comparison processing,
outputs the digitized first comparison result signal corresponding to a time in accordance with a quantity of the overflow charge and
handles a light level from a signal level of the photoelectric conversion element in a maximum sampling time at which the overflow charge begins to overflow from the photoelectric conversion element to the output node to a signal level obtained in a minimum sampling time.

10. The solid-state imaging device according to claim 1, wherein:
the integration period is a period from when the photoelectric conversion element and the output node are reset to a reset level to when the transfer element is switched to a conductive state and the transfer period is started,
the period of the first comparison processing is a period from when the photoelectric conversion element and the output node are reset to the reset level to when the output node is reset to the reset level before the transfer period is started, and
a period of the second comparison processing is a period after the output node is reset to the reset level and is a period including the period after the transfer period.

11. The solid-state imaging device according to claim 1, wherein:
the reading part performs control so as to selectively perform the first comparison processing and the second comparison processing corresponding to a light intensity.

12. The solid-state imaging device according to claim 11, wherein:
the reading part
performs control so as to perform the first comparison processing and the second comparison processing in a case of normal light intensity,
performs control so as to perform the first comparison processing in a case of a higher light intensity than the normal light intensity, and
performs control so as to perform the second comparison processing in a case of a lower light intensity than the normal light intensity.

13. The solid-state imaging device according to claim 1, wherein:
the reading part, with respect to the comparator, performs control so as to output the digitized first comparison result signal with respect to the voltage signal corresponding to the charge according to the first comparison processing even in a case where the overflow charge does not overflow from photoelectric conversion element to the output node in the integration period.

14. The solid-state imaging device according to claim 1, wherein:
the pixel includes a floating diffusion as the output node and a reset element which resets the floating diffusion to a predetermined potential in a reset period, and the output buffer part includes
a source follower element converting the charge in the floating diffusion to a voltage signal in accordance with a quantity of the charge and outputting the converted signal and
a current source connected to a source of the source follower element.

15. The solid-state imaging device according to claim 1, wherein:
in the comparator, the voltage signal of the output buffer part is supplied to a first input terminal,
the reference voltage is supplied to a second input terminal, and
a coupling capacitor is connected to a supply line of the voltage signal to the first input terminal.

16. The solid-state imaging device according to claim 1, wherein:
in the comparator, a reset switch is connected between an output terminal and a first input terminal, and
a load capacitor is connected on the output terminal side.

17. The solid-state imaging device according to claim 1, wherein:
the device includes
a first substrate and
a second substrate,
the first substrate and the second substrate have a stacked structure where the two substrates are connected through a connection part,
at least the photoelectric conversion element, the transfer element, the output node, and the output buffer part in the pixel are formed on the first substrate, and
at least the comparator, the memory part, and at least a portion of the reading part are formed on the second substrate.

18. The solid-state imaging device according to claim 17, wherein:
the pixel includes a floating diffusion as the output node and a reset element which resets the floating diffusion to a predetermined potential in a reset period,
the output buffer part includes
a source follower element converting the charge in the floating diffusion to a voltage signal in accordance with a quantity of the charge and outputting the converted signal, and
a current source connected to a source of the source follower element,
the floating diffusion, the reset element, and the source follower element are formed on the first substrate, and
the current source is formed on the first substrate or the second substrate.

19. A method for driving a solid-state imaging device having:
a pixel part in which pixels for performing photoelectric conversion are arranged, and
a reading part which reads out pixel signals from the pixels in the pixel part, wherein
each pixel includes:
a photoelectric conversion element which accumulates a charge generated by photoelectric conversion in an integration period,
a transfer element capable of transferring the charge accumulated in the photoelectric conversion element in a transfer period after the integration period,
an output node formed by a floating diffusion to which the charge accumulated in the photoelectric conversion element is transferred through the transfer element,
an output buffer part which converts the charge at the output node to a voltage signal corresponding to a quantity of the charge and outputs the converted voltage signal,
a comparator which performs comparison processing for comparing the voltage signal of the output buffer part and a reference voltage and outputting a digitized comparison result signal, and
a memory part for storing data corresponding to the digitized comparison result signal of the comparator,
the method for driving a solid-state imaging device comprising
when reading out the pixel signals of the pixels, in the comparator, under control of the reading part,
performing a first comparison processing for outputting a digitized first comparison result signal with respect to the voltage signal corresponding to an overflow charge overflowing from the photoelectric conversion element to the output node in the integration period, and
performing a second comparison processing for outputting a digitized second comparison result signal with respect to the voltage signal corresponding to the accumulated charge of the photoelectric conversion element transferred to the output node in the transfer period after the integration period, and
in the first comparison processing, dividing a period of the first comparison processing into a plurality of sub periods, and
in each of the sub periods, performing analog-to-digital (AD) conversion processing for comparing the voltage signal of the output buffer part and the reference voltage and outputting the digitized comparison result signal.

20. An electronic apparatus, comprising:
a solid-state imaging device, and
an optical system for forming a subject image in the solid-state imaging device, wherein
the solid-state imaging device has
a pixel part in which pixels for performing photoelectric conversion are arranged, and
a reading part which reads out pixel signals from the pixels in the pixel part,
each pixel includes
a photoelectric conversion element which accumulates a charge generated by photoelectric conversion in an integration period,
a transfer element capable of transferring the charge accumulated in the photoelectric conversion element in a transfer period after the integration period,
an output node formed by a floating diffusion to which the charge accumulated in the photoelectric conversion element is transferred through the transfer element,
an output buffer part which converts the charge at the output node to a voltage signal corresponding to a quantity of the charge and outputs the converted voltage signal, and
a comparator which performs comparison processing for comparing the voltage signal of the output buffer part and a reference voltage and outputting a digitized comparison result signal, and
a memory part for storing data corresponding to the digitized comparison result signal of the comparator,
the comparator, under control of the reading part, performs
a first comparison processing for outputting a digitized first comparison result signal with respect to the voltage signal corresponding to an overflow charge overflowing from the photoelectric conversion element to the output node in the integration period, and a second comparison processing for outputting a digitized second comparison result signal with respect to the voltage signal corresponding to the accumulated charge of the photoelectric conversion element transferred to the output node in the transfer period after the integration period and, in the first comparison processing, a period of the first comparison processing is divided into a plurality of sub periods, and in each of the sub periods, the comparator performs analog-to-digital (AD) conversion processing for comparing the voltage signal of the output buffer part and the reference voltage and outputting the digitized comparison result signal.

* * * * *